(12) United States Patent
Hirabayashi et al.

(10) Patent No.: US 9,082,842 B2
(45) Date of Patent: Jul. 14, 2015

(54) SEMICONDUCTOR DEVICE

(75) Inventors: Yasuhiro Hirabayashi, Toyota (JP); Masaru Senoo, Okazaki (JP)

(73) Assignee: TOYOTA JIDOSHA KABUSHIKI KAISHA, Toyota-Shi (JP)

(*) Notice: Subject to any disclaimer, the term of this patent is extended or adjusted under 35 U.S.C. 154(b) by 0 days.

(21) Appl. No.: 14/359,761

(22) PCT Filed: Nov. 22, 2011

(86) PCT No.: PCT/JP2011/076942
§ 371 (c)(1),
(2), (4) Date: May 21, 2014

(87) PCT Pub. No.: WO2013/076820
PCT Pub. Date: May 30, 2013

(65) Prior Publication Data
US 2014/0291757 A1    Oct. 2, 2014

(51) Int. Cl.
| H01L 29/76 | (2006.01) |
| H01L 29/94 | (2006.01) |
| H01L 31/062 | (2012.01) |
| H01L 31/113 | (2006.01) |
| H01L 31/119 | (2006.01) |
| H01L 29/78 | (2006.01) |
| H01L 29/739 | (2006.01) |
| H01L 29/40 | (2006.01) |
| H01L 29/423 | (2006.01) |
| H01L 29/06 | (2006.01) |

(52) U.S. Cl.
CPC ............ *H01L 29/78* (2013.01); *H01L 29/0696* (2013.01); *H01L 29/407* (2013.01); *H01L 29/4236* (2013.01); *H01L 29/4238* (2013.01); *H01L 29/7397* (2013.01); *H01L 29/7811* (2013.01); *H01L 29/7813* (2013.01); *H01L 29/0615* (2013.01); *H01L 29/0619* (2013.01)

(58) Field of Classification Search
CPC ............ H01L 29/7813; H01L 29/7397; H01L 29/1095; H01L 29/0696; H01L 29/7811; H01L 29/407; H01L 29/4236; H01L 29/0619
USPC ......................................... 257/330, E29.201
See application file for complete search history.

(56) References Cited

U.S. PATENT DOCUMENTS

| 2002/0187597 A1 | 12/2002 | Ninomiya |
| 2002/0190313 A1 | 12/2002 | Takaishi et al. |
| 2009/0085146 A1 | 4/2009 | Aoki |

FOREIGN PATENT DOCUMENTS

| JP | 10-214968 A | 8/1998 |
| JP | 2002-368221 A | 12/2002 |
| JP | 2002-373988 A | 12/2002 |
| JP | 2009-088360 A | 4/2009 |
| JP | 2010-267677 A | 11/2010 |

*Primary Examiner* — Thien F Tran
(74) *Attorney, Agent, or Firm* — Kenyon & Kenyon LLP

(57) ABSTRACT

A semiconductor device disclosed herein includes an insulated gate, a main and a sub trench conductors. The main and sub trench conductors are formed in the cell region, and have a conductor that is covered with an insulation film and fills a trench extending in a first direction. The sub trench is located, with respect to the main trench conductor, in a second direction perpendicularly crossing the first direction and extending from the cell region side to the non-cell region. Length of the sub trench conductor in the first direction is shorter than a length of the insulated gate in the first direction. Distance between the main and sub trench conductors is shorter than a distance between the main trench conductor and the insulated gate. At least a part of the sub trench conductor reaches a position deeper than a boundary between the first and second semiconductor regions.

2 Claims, 18 Drawing Sheets

SEMICONDUCTOR DEVICE

CROSS-REFERENCE TO RELATED APPLICATIONS

This is a national phase application based on the PCT International Patent Application No. PCT/JP2011/076942filed on Nov. 22, 2011, the entire contents of which are incorporated herein by reference.

TECHNICAL FIELD

A technology described in the present description relates to a semiconductor device having a trench gate structure.

BACKGROUND ART

In a semiconductor device of a trench gate type, when excessive concentration of an electric field occurs at a bottom of an insulated gate, the semiconductor device may be broken. For the purpose of preventing the electric field concentration, for example, Japanese Patent Application Publication No. 2009-88360 (Patent Document 1) has disclosed a vertical metal-oxide-semiconductor field-effect transistor (MOSFET) in which an insulated gate of a trench type is formed in a cell region, and a trench filled with an insulator is formed in a peripheral region that is a non-cell region. The trench filled with the insulator is formed in a p-type resurf layer in the peripheral region. When a voltage is applied across source and drain electrodes of the MOSFET, a depletion layer spreading from a pn junction of the MOSFET expands until it reaches the trench filled with the insulator in the peripheral region. This uniformizes the spreading of the depletion layer in the peripheral region, and improves a breakdown voltage of the MOSFET.

CITATION LIST

Patent Literature

Patent Document 1: Japanese Patent Application Publication No. 2009-88360

SUMMARY OF INVENTION

Technical Problem

In the MOSFET of Patent Document 1, the trench in the peripheral region is filled with the insulator. Therefore, when the depletion layer expands from the pn junction of the MOSFET, the electric field expands along the depletion layer in the course of nature. Therefore, the electric field concentrates at a bottom of a portion located at an outermost periphery of the trench in the peripheral region. Consequently, the breakdown voltage of the semiconductor device deteriorates.

Solution to Problem

A first semiconductor device disclosed in the present description includes a semiconductor substrate including a cell region, and a non-cell region arranged around the cell region. The cell region includes a first semiconductor region of a first conductivity type, a second semiconductor region of a second conductivity type formed on a surface of the semiconductor substrate on a front surface side of the first semiconductor region, an insulated gate of a trench type extending from a surface side of the semiconductor substrate through the second semiconductor region to a depth where the insulated gate is in contact with the first semiconductor region, a lengthwise direction of the insulated gate being extended in a first direction, and a first trench conductor formed at least partially in the cell region between the insulated gate and the non-cell region, and having a conductor that is covered with an insulation film and fills a trench. The first trench conductor includes a first portion extending in the first direction, and a second portion protruding in a second direction perpendicularly crossing the first direction and extending from a cell region side toward the non-cell region, and at least a part of a bottom of the second portion reaches a position deeper than a boundary between the first and second semiconductor regions.

According to the first semiconductor device described above, at least a part of the first trench conductor filled with the conductor covered with the insulation film is formed in the cell region between the insulated gate and the non-cell region. An application of a voltage to the first trench conductor can suppress local concentration of an electric field at the bottom of the first trench conductor. Since the first trench conductor has the second portion protruding in the second region, an electric field distribution in the bottom of the first trench conductor and the insulated gate can be extended in the second direction. Consequently, a breakdown voltage of the semiconductor device can be improved.

The first semiconductor device described above may further include a second trench conductor formed at least partially in the cell region between the first portion of the first trench conductor and the non-cell region, and having a conductor that is covered with the insulation film and fills a trench. The second trench conductor is positioned in the second direction with respect to the first portion of the first trench conductor. A length of the second trench conductor in the first direction is shorter than a length of the insulated gate in the first direction. A distance between the first portion of the first trench conductor and the second trench conductor is shorter than a distance between the first trench conductor and the insulated gate nearest to the first trench conductor, and at least a part of the second trench conductor reaches a position deeper than the boundary between the first and second semiconductor regions.

A second semiconductor device disclosed in the description includes a semiconductor substrate including a cell region, and a non-cell region arranged around the cell region. The cell region includes a first semiconductor region of a first conductivity type, a second semiconductor region of a second conductivity type formed on a surface of the semiconductor substrate on a front surface side of the first semiconductor region, an insulated gate of a trench type extending from a surface side of the semiconductor substrate through the second semiconductor region to a depth where the insulated gate is in contact with the first semiconductor region, a lengthwise direction of the insulated gate being extended in a first direction, a third trench conductor formed in the cell region between the insulated gate and the non-cell region, and having a conductor that is covered with an insulation film and fills a trench extending in the first direction, and a fourth trench conductor formed at least partially in the cell region between the insulated gate and the non-cell region, and having a conductor that is covered with the insulation film and fills a trench located, with respect to the third trench conductor, in a second direction perpendicularly crossing the first direction and extending from a cell region side toward the non-cell region. A length of the fourth trench conductor in the first direction is shorter than a length of the insulated gate in the first direction. A distance between the third and fourth trench conductors is shorter than a distance between the third trench conductor and the insulated gate nearest to the third trench conductor. At least a part of the fourth trench conductor reaches a position deeper than a boundary between the first and second semiconductor regions.

In the second semiconductor device described above, the voltage is applied to the third and fourth trench conductors, and thereby local concentration of the electric field at a bottom of the fourth trench conductor can likewise be suppressed. Since the fourth trench conductor is positioned, with respect to the third trench conductor, in the second direction which is perpendicular to the first direction and extending from the cell region side toward the non-cell region, electric field distribution in the bottoms of the insulated gate and the third and fourth trench conductors can expand in the second direction. Consequently, the breakdown voltage of the semiconductor device can be improved similarly to the first semiconductor device.

DESCRIPTION OF EMBODIMENTS

Figure 1:
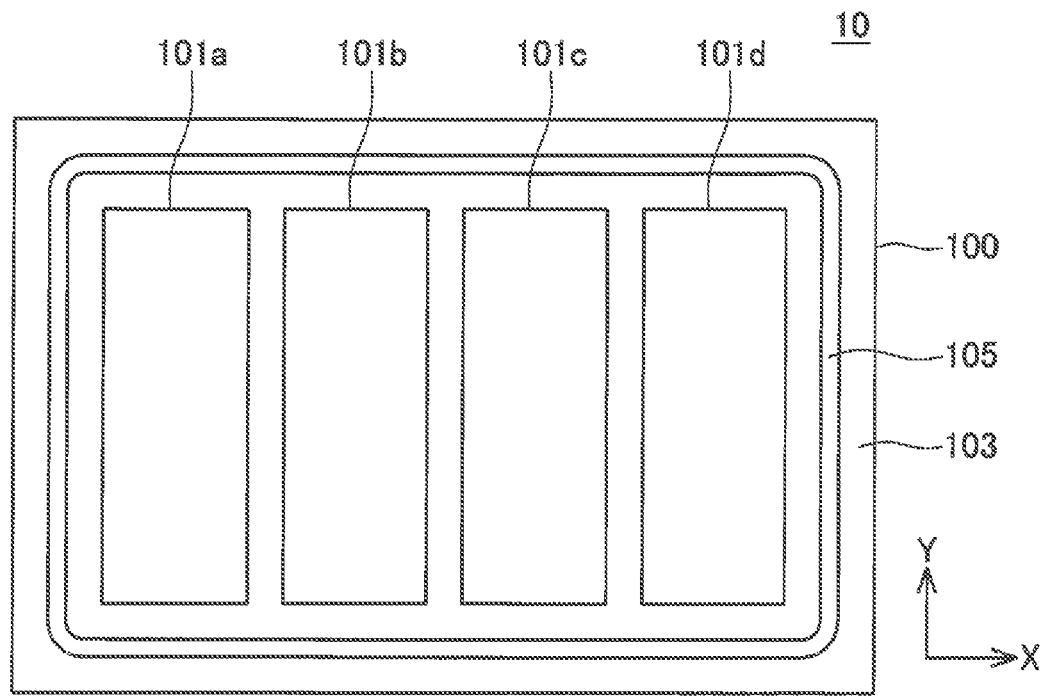
FIG. 1 is a plan view showing a semiconductor device of Embodiment 1.

Each of first and second semiconductor devices disclosed in the description has a semiconductor substrate including a cell region, and a non-cell region arranged around the cell region. The cell region includes a first semiconductor region of a first conductivity type, a second semiconductor region of a second conductivity type formed on a surface of the semiconductor substrate on a front surface side of the first semiconductor region, and an insulated gate of a trench type extending from a surface side of the semiconductor substrate through the second semiconductor region to a depth where the insulated gate is in contact with the first semiconductor region, a lengthwise direction of the insulated gate being extended in a first direction. The insulated gate includes a gate electrode filling the trench and covered with a gate insulation film. Each of the first and second semiconductor devices may further include a front surface electrode formed on a front surface of the cell region and a rear surface electrode formed on a rear surface of the cell region.

In the first semiconductor device, a first trench conductor included at least partially in the cell region is formed between the insulated gate and the non-cell region. The first trench conductor may be formed entirely in the cell region, or may be partially formed in the non-cell region. The first trench conductor includes a conductor filling a trench and covered with an insulation film. The first trench conductor includes a first portion extending in a first direction, and a second portion protruding in a second direction perpendicularly crossing the first direction and extending from a cell region side toward the non-cell region. At least a part of a bottom of the second portion reaches a position deeper than a boundary between the first and second semiconductor regions. Preferably, conductors of the first and second portions are electrically connected together. The conductors of the first and second portions may be formed integrally with each other. A length in the first direction of the first portion of the first trench conductor may be equal to or different from a lengthwise length of the insulated gate. The first trench conductor may have the only one second portion, and may contain a plurality of second portions. When the first trench conductor has the plurality of second portions, the second portions may have the same size and the same form, or may have different sizes and different forms, respectively.

In the second semiconductor device, third and fourth trench conductors are formed between the insulated gate and the non-cell region. Each of the third and fourth trench conductors includes a conductor covered with an insulation film and filling a trench. The third trench conductor is formed in the cell region, and extends in the first direction. The fourth trench conductor is formed at least partially in the cell region. The fourth trench conductor may be entirely formed in the cell region, or may be partially formed in the non-cell region. Assuming that the second direction is perpendicular to the first direction and extends from the cell region side toward the peripheral region, the fourth trench conductor is positioned in the second direction with respect to the third trench conductor. The fourth trench conductor is shorter in length in the first direction than the insulated gate. The fourth trench conductor is shorter in length in the first direction than the insulated gate. A distance between the third and fourth trench conductors is shorter than a distance between the third trench conductor and the insulated gate nearest to the third trench conductor. At least a part of the fourth trench conductor reaches a position deeper than a boundary between the first and second semiconductor regions. The lengthwise direction of the fourth trench conductor may be the first direction, or may be the second direction. Also, it may be a third direction crossing the first and second directions. The semiconductor device may include only one fourth trench conductor or a plurality of fourth trench conductors. When the semiconductor device includes the plurality of fourth trench conductors, the fourth trench conductors may have the same size and/or the same form, or may have different sizes and/or different forms, respectively. The third trench conductor may have the same form and size as the insulated gate. A distance between the third trench conductor and the insulated gate nearest to the third trench conductor may be equal to a distance (gate pitch) in the second direction between a plurality of neighboring insulated gates.

The semiconductor device disclosed in the present application may include both the structures of the first and second semiconductor devices. For example, the first semiconductor device may be additionally provided with the third and fourth trench conductors according to the second semiconductor device. The second trench conductor may be further arranged at the vicinity of the first trench conductor of the first semiconductor device. The second trench conductor is arranged between the first portion of the first trench conductor and the non-cell region, and is positioned in the second direction with respect to the first trench conductor. The second trench conductor is formed at least partially in the cell region. A distance in the second direction between the second trench conductor and the first portion of the first trench conductor is shorter than a distance between the first trench conductor and the insulated gate nearest to the first trench conductor. The form, direction and sizes of the second trench conductor are substantially the same as those of the fourth trench conductor, and therefore will not be described.

The forms of the bottoms and the side portions of the first to fourth trench conductors are not particularly restricted. The forms of the bottoms and the side portions of these trench conductors may include planar, stepped, curved, inclined forms or the like, or combinations of them.

The first to fourth trench conductors may be electrically connected to the gate electrode in the insulated gate, the front surface electrode, the rear surface electrode or the like. Also, these may be in a floating state electrically disconnected from the gate electrode, the front surface electrode, the rear surface electrode or the like.

The first and second semiconductor devices according to the present application are merely required to have a trench gate structure. MOS-type semiconductor devices and diodes such as IGBT and MOSFET can be listed as the semiconductor devices having the trench gate structure. When the first and second semiconductor devices are IGBTs, respectively, the first semiconductor region is a drift region, the second semiconductor region is a body region, an emitter region of a first conductivity type is arranged at the front surface of the second semiconductor region, and a collector region is arranged on the rear surface side of the semiconductor substrate. When the first and second semiconductor devices are MOSFETs, respectively, the first semiconductor region is a drain or drift region, the second semiconductor region is a body region, and a source region of the first conductivity type is arranged at a front surface of the second semiconductor region. When the first and second semiconductor devices are diodes, the first and second semiconductor regions function as cathode and anode layers, respectively.

In the first and second semiconductor devices according to the present application, a form and arrangement of the insulated gate in a plan view of the semiconductor device are not particularly restricted. A plurality of insulated gates each having substantially a linear form may be arranged parallel to each other, and the insulated gate may have a curved or coil-like form. The insulated gates may cross together, and also may be serially coupled together into a substantially circular or rectangular form. In the first semiconductor device, the first portion of the first trench conductor may have substantially the same form as the insulated gate. As embodiments and modifications described below, IGBTs will be described as examples of semiconductor devices. However, these are not restrictive, and semiconductor devices such as MOSFETs and others having a trench gate structure may likewise be available. For example, description about an installation position of an emitter layer in an IGBT may also be applied to an installation position of a source layer of an MOSFET.

[Embodiment 1]

Figure 2:
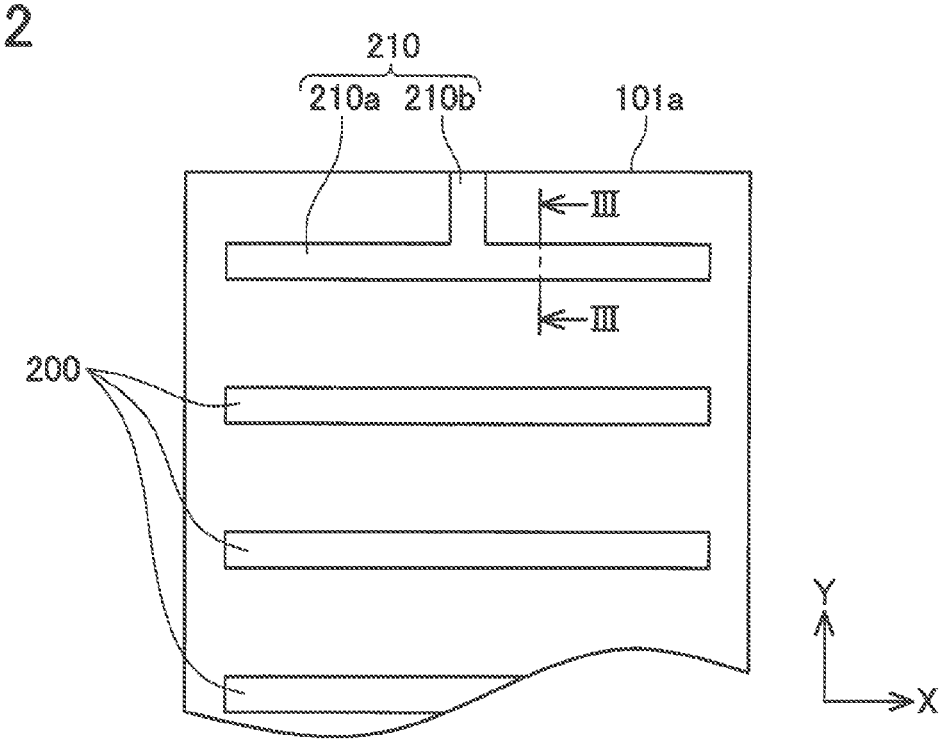
FIG. 2 is a view partially enlarging a cell region in the plan view of the semiconductor device in FIG. 1.

As shown in FIG. 1, a semiconductor device 10 according to Embodiment 1 has semiconductor substrate 100 including cell regions 101a to 101d and a peripheral region 103. The peripheral region 103 is a non-cell region arranged around the cell regions 101a to laid. The peripheral region 103 is arranged along a periphery of the semiconductor substrate 100, and surrounds all of cell regions 101a to 101d. The cell regions 101a to 101d are arranged in a central portion of the semiconductor substrate 100, and a peripheral voltage-resistant portion 105 surrounding them is formed in the peripheral region 103. As shown in FIG. 2, the cell region 101a is provided with a plurality of insulated gates 200 of a trench type. The insulated gates 200 have linear forms in a plan view, respectively, and have the same size and the same form. The insulated gates 200 are arranged at a constant gate pitch (distance in a Y direction between the insulated gates 200), and lengthwise directions (X direction shown in FIG. 2) thereof are parallel to each other.

Figure 3:
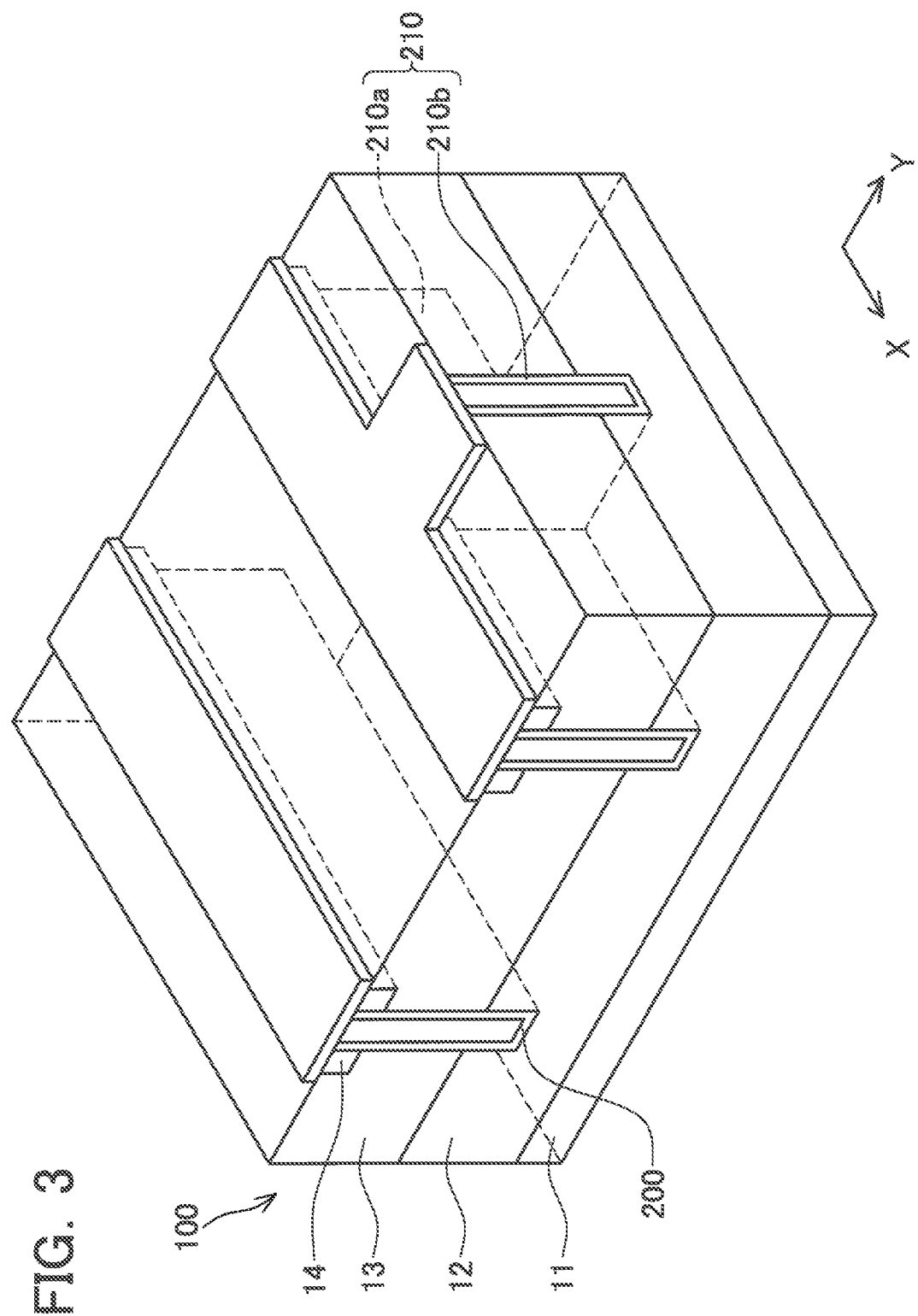
FIG. 3 is a perspective view including a section taken along line III-III in FIG. 2.

As shown in FIG. 3, the semiconductor device 10 is provided at the cell region 101a with an IGBT of a trench gate type. The semiconductor substrate 100 includes a $p^+$ type collector layer 11, an $n^-$ type drift layer 12, a p-type body layer 13, and an $n^+$ type emitter layer 14. The insulated gate 200 extends from a surface side of the semiconductor substrate 100 through the body layer 13 and the emitter layer 14, and reaches the drift layer 12. The insulated gate 200 includes a gate electrode covered with a gate insulation film and filling a trench. The emitter layer 14 extends in the lengthwise direction (X direction in FIG. 3) of the insulated gate 200, and is in contact with the gate insulation film of the insulated gate 200.

As shown in FIGS. 2 and 3, a first trench conductor 210 is formed between the insulated gate 200 and the peripheral region 103 of the semiconductor device 10. The first trench conductor 210 is formed in the cell region 101a. The first trench conductor 210 includes a conductor covered with an insulation film and filling the trench. The first trench conductor 210 includes first and second portions 210a and 210b. The first and second portions 210a and 210b are integral with each other, and conductors and insulation films covering the conductors are formed of the same layers, respectively. The first portion 210a extends lengthwise in a first direction (X direction in FIGS. 2 and 3). The second portion 210b extends lengthwise in a second direction (Y direction shown in FIGS. 2 and 3) that is perpendicular to the first direction and extends from a cell region side toward the peripheral region. An end in the Y direction of the second portion 210b extends to the end of the cell region 101a. The second portion 210b extends in the second direction from a central position in the first direction of the first portion 210a. The first trench conductor 210 has a T form in a plan view of the semiconductor substrate 100. The size of the first portion 210a in the lengthwise direction (X direction) is equal to size of the insulated gate 200 in the lengthwise direction (X direction). The lengthwise and widthwise sizes (Y and X directions) of the second portion 210b are shorter than the lengthwise size of the first portion 210a. Bottoms of the first and second portions 210a and 210b are located deeper than a boundary between the body layer 13 and the drift layer 12. A distance between the insulated gate 200 and the first trench conductor 210 is equal to a gate pitch of the insulated gates 200. Although not shown, the cell regions 101b to 101d are provided with the plurality of insulated gates and first trench conductors, similarly to the cell region 101a.

Figure 4:
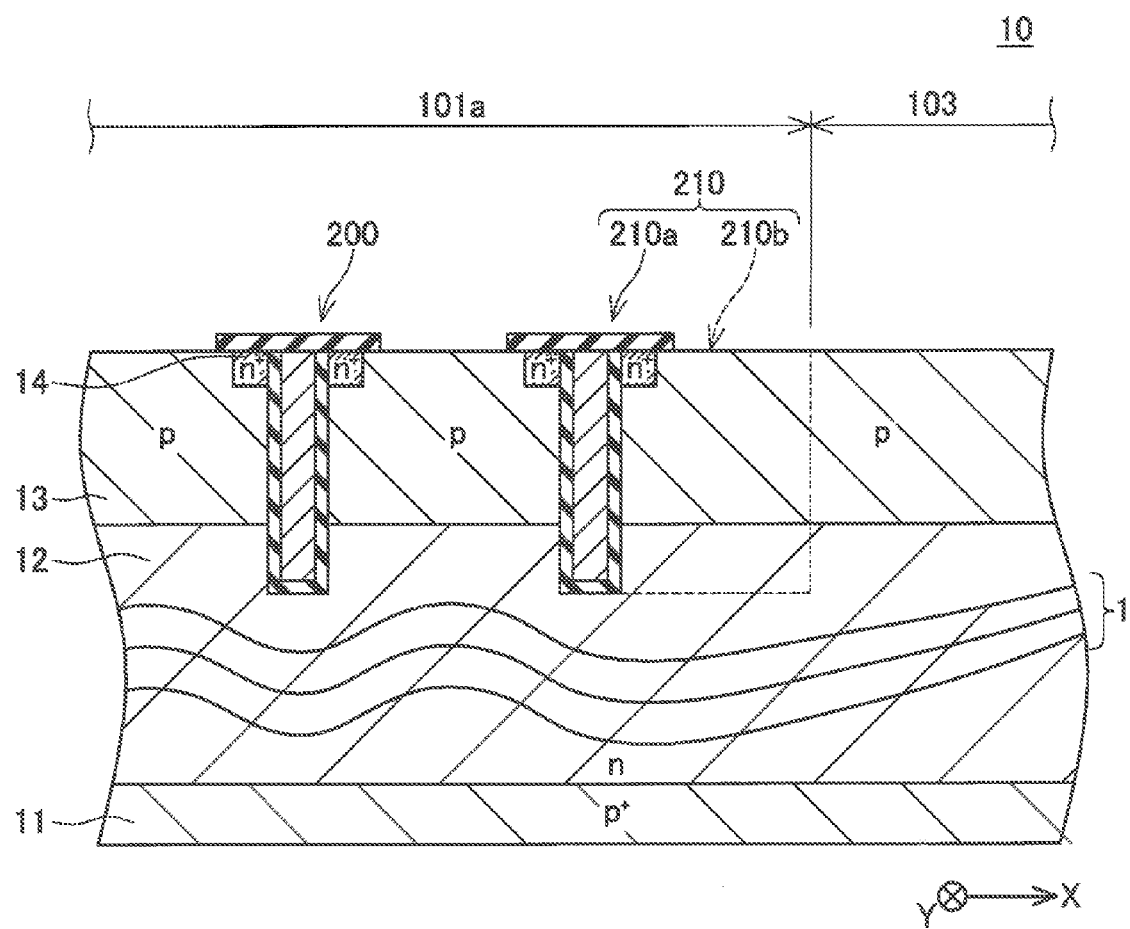
FIG. 4 is a view conceptually showing electric field distribution around a first trench conductor in Embodiment 1.

As shown in FIGS. 1 to 3, the semiconductor device 10 has the first trench conductors 210 formed in the cell regions 101a to 101d between the insulated gates 200 and the peripheral region 103. When the IGBT in the cell region is turned on, a voltage (e.g. gate voltage) is applied to the first trench conductor 210 so that an electric field at the bottoms of the insulated gate 200 and the first trench conductor 210 expands in the Y direction. Therefore, as shown in FIG. 4, the distribution of the electric field near the bottoms of the insulated gate 200 and the first trench conductor 210 is gradual as indicated by equipotential line 1. Since the semiconductor device 10 rah suppress local concentration of the electric field at the bottoms of the insulated gate 200 and the first trench conductor 210, the breakdown voltage of the semiconductor device 10 is improved. Since the breakdown voltage of the semiconductor device can be ensured, an area of the peripheral voltage-resistant portion 105 occupying the plane of the semiconductor substrate 100 can be reduced, which contributes to reduction in size of the semiconductor device 10.

(Modification)

Figure 5:
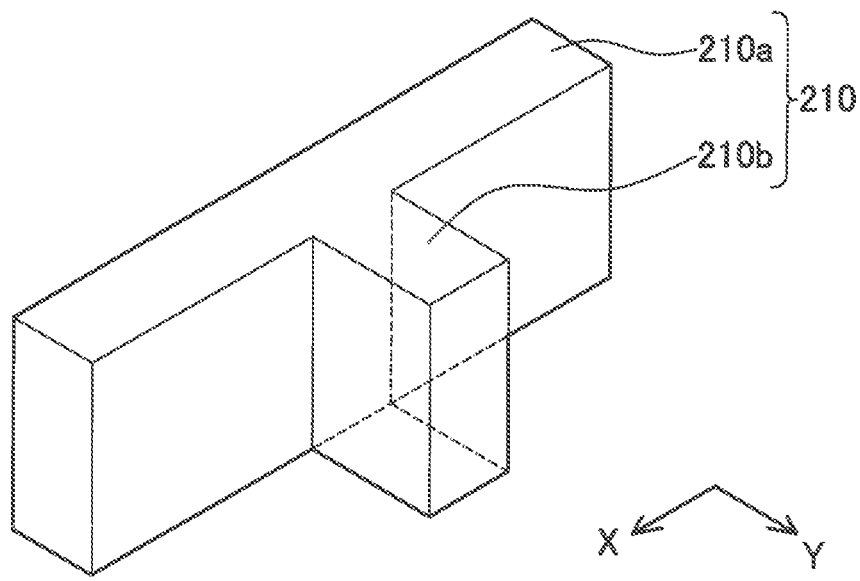
FIG. 5 is a perspective view of the first trench conductor of the semiconductor device according to Embodiment 1.
Figure 6:
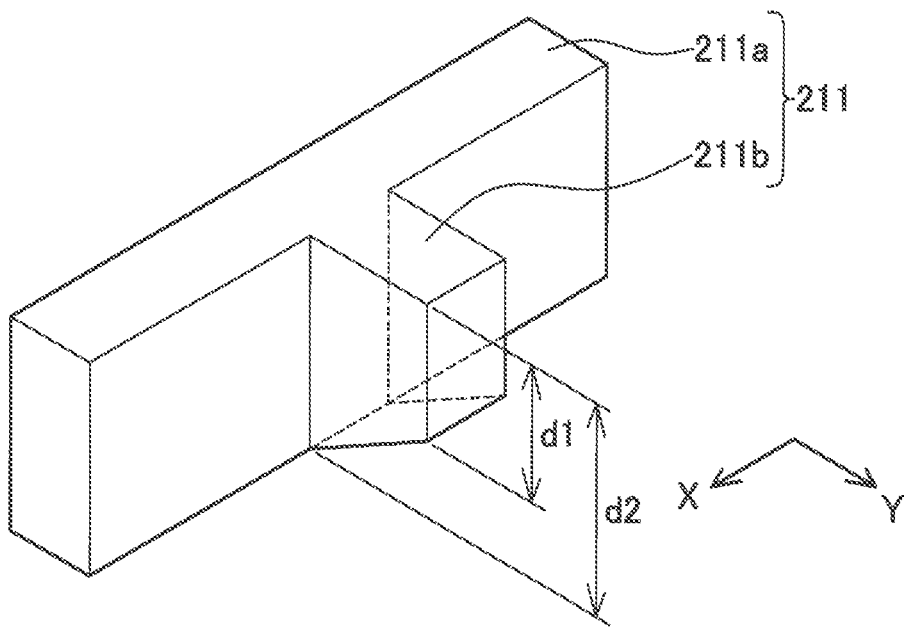
FIG. 6 is a perspective view of the first trench conductor of the semiconductor device according to a modification.
Figure 7:
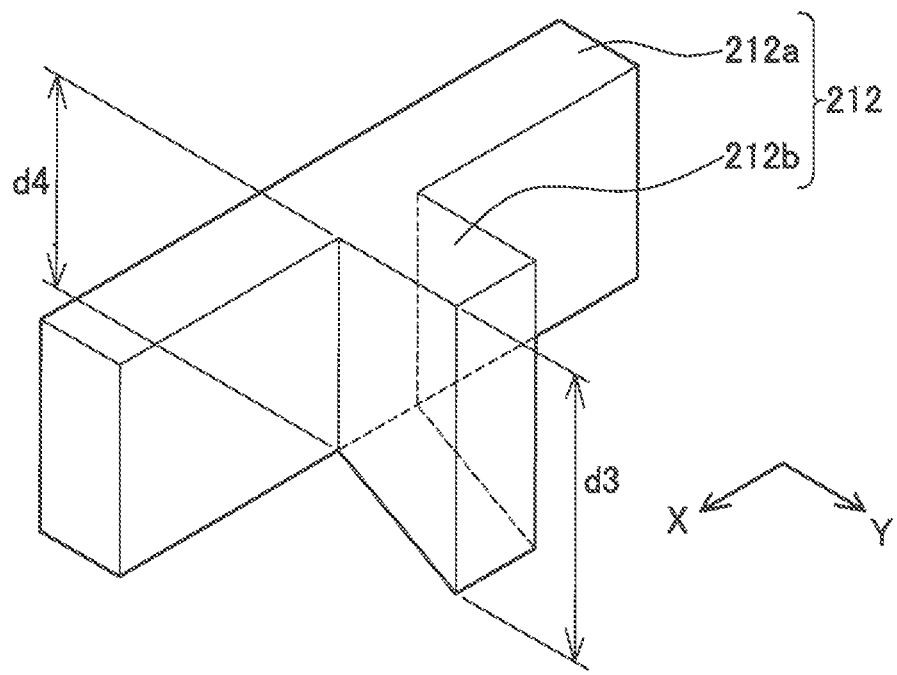
FIG. 7 is a perspective view of the first trench conductor of the semiconductor device according to the modification.

The first trench conductor may have a form other than that already described. FIGS. 6 to 14 show a form of the first trench conductor according to a modification of Embodiment 1, and FIG. 5 shows, for comparison, the form of the first trench conductor 210 according to Embodiment 1. FIGS. 6 to 9 are perspective views showing the first trench conductor of the semiconductor device according to a modification, similarly to FIG. 5. As shown in FIG. 6, a second portion 211b of a first trench conductor 211 may be configured to reduce its depth linearly as the position moves in the second direction (Y direction). The second portion 211b has a depth d2 on a side near a first portion 211a, and has a depth d1 on the opposite side. The depth d2 is larger than the depth d1. Conversely, as shown in FIG. 7, a second portion 212b of a first trench conductor 212 may be configured to increase its depth linearly as the position moves in the second direction (Y direction). The second portion 212b has a depth d4 on a side near a first portion 212a, and has a depth d3 on the opposite side. The depth d3 is larger than the depth d. In the case of FIGS. 6 and 7, at least the depths d2 and d3 are larger than a depth of the boundary between the body layer 13 and the drift layer 12 shown in FIG. 3.

Figure 8:
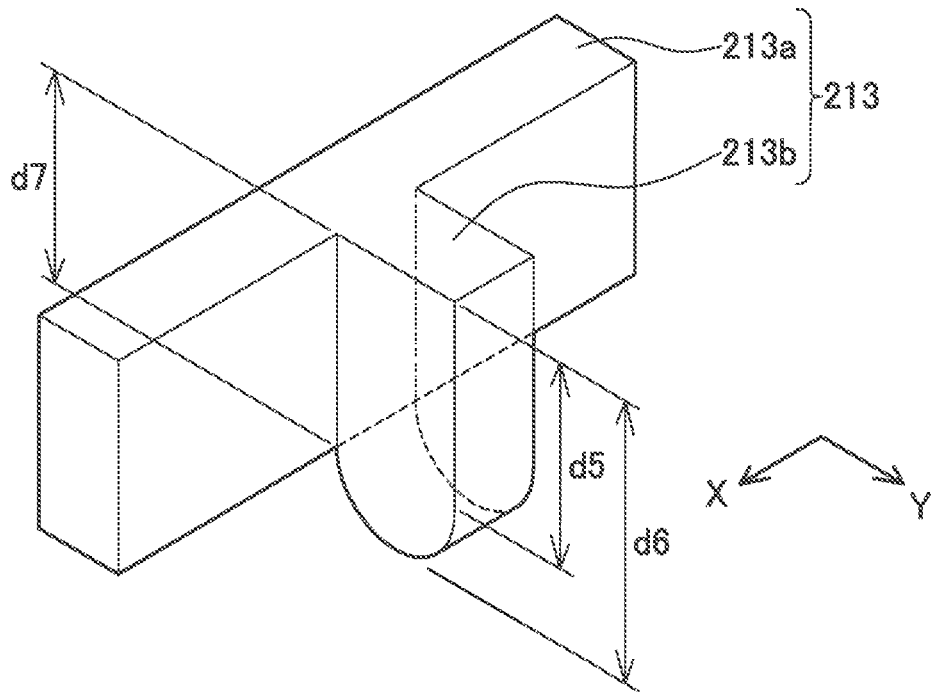
FIG. 8 is a perspective view of the first trench conductor of the semiconductor device according to the modification.

As shown in FIG. 8, a second portion 213b of a first trench conductor 213 may have a curved bottom. When the bottom of the second portion 213b is viewed in the X direction, it is arced and extended in the Y direction from a first portion 213a. The second portion 213b has a depth d5 on each of the first portion 213a side and the opposite side, and has a depth d6 at a central position in the Y direction. The depth d6 is larger than the depth d5. In FIG. 8, at least the depth d6 is larger than a depth of the boundary between the body layer 13 and the drift layer 12 shown in FIG. 3. Since the first trench conductor 213 includes the second portion 213b having a curved surface at the bottom, an effect of dispersing the electric field at the vicinity of the bottom of the second portion 213b is high. This increases the effect of improving the breakage voltage of the semiconductor device.

The first trench conductor of the form shown in FIGS. 6 to 8 can be formed, for example, by performing trench etching several times with different etching depths. For example, when a trench width is designed to increase as a trench depth increases, the bottom of the first trench conductor shown in FIGS. 6 to 8 can be formed by performing the trench etching fewer times.

Figure 9:
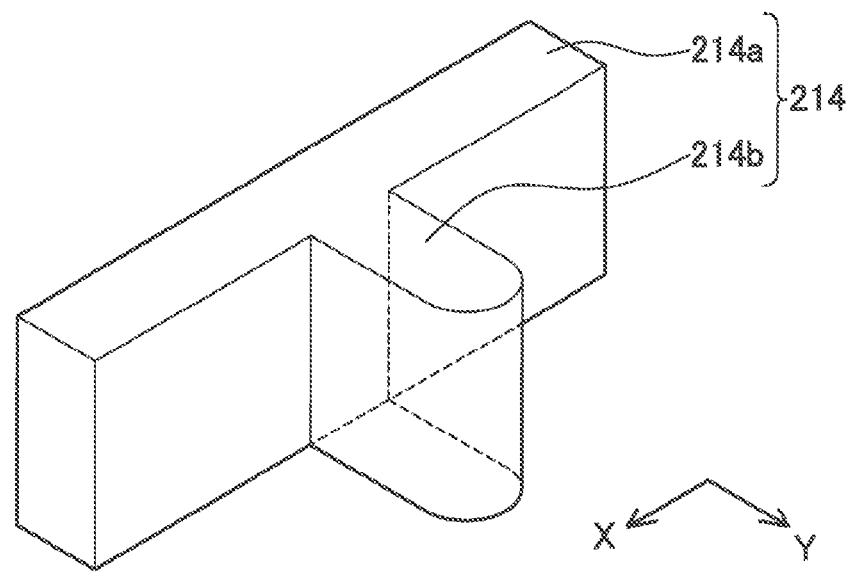
FIG. 9 is a perspective view of the first trench conductor of the semiconductor device according to the modification.

As shown in FIG. 9, the side end surface (remote from a first portion 214a) in the second direction (Y direction) of a second portion 214b of a first trench conductor 214 may be a curved surface. In a plan view viewed in the direction perpendicular to the Y and X directions, the side end surface of the second portion 214b has an arc form. Since the first trench conductor 214 includes the second portion 214b having the curved side end surface, the effect of dispersing the electric field at the vicinity of the side end surface of the second portion 214b is high. This increases the effect of improving the breakage voltage of the semiconductor device.

Figure 10:
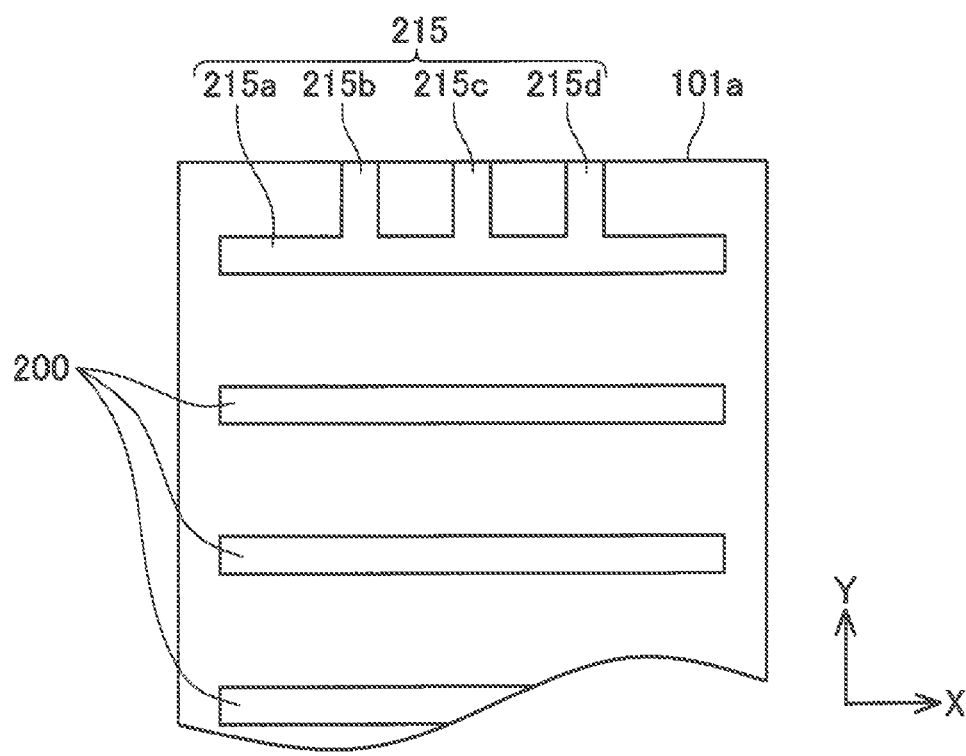
FIG. 10 is a plan view of the semiconductor device according to a modification, and showing, on an enlarged scale, a part of a cell region.
Figure 11:
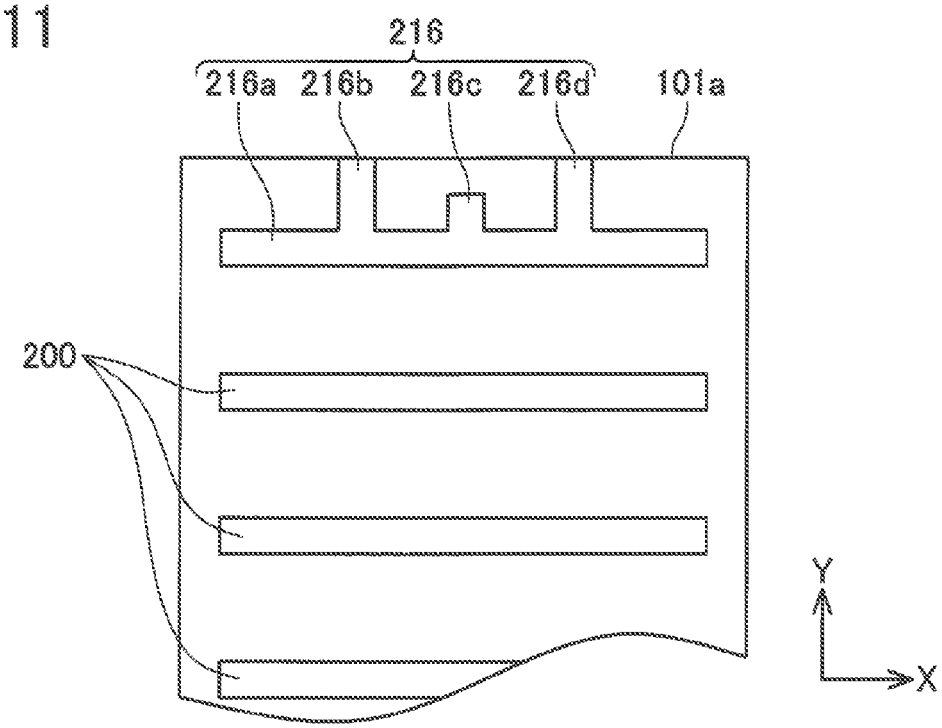
FIG. 11 is a plan view of the semiconductor device according to the modification, and showing, on an enlarged scale, a part of the cell region.

FIGS. 10 to 14 are plan views similar to FIG. 2, and show the first trench conductor of the semiconductor device according to a modification. In FIGS. 10 to 14, the substantially same structures as those in FIG. 2 will not be described. As shown in FIGS. 10 and 11, the first trench conductor may have a plurality of second portions. As shown in FIG. 10, a first trench conductor 215 has three second portions 215b, 215c and 215d. The second portions 215b, 215c and 215d have the same size and the same form, and extend to the cell region 101a in the second direction (Y direction). The second portion 215e is arranged in a central position in the first direction (X direction) of the first portion 215a. As shown in FIG. 11, a first trench conductor 216 has three second portions 216b, 216c and 216d. The second portions 216b and 216d have the same size and the same form. The second portion 216c has the same length in the first direction (X direction) as the second portions 216b and 216d. The length in the second direction (Y direction) of the second portion 216e is shorter than the lengths in the second direction of the second portions 216b and 216d. The second portions 216b and 216d extend in the second direction (Y direction) to the cell region 101a. The second portion 215c is located in a central position in the first direction (X direction) of the first portion 215a, and its end in the second direction does not reach the end of the cell region 101a.

Figure 12:
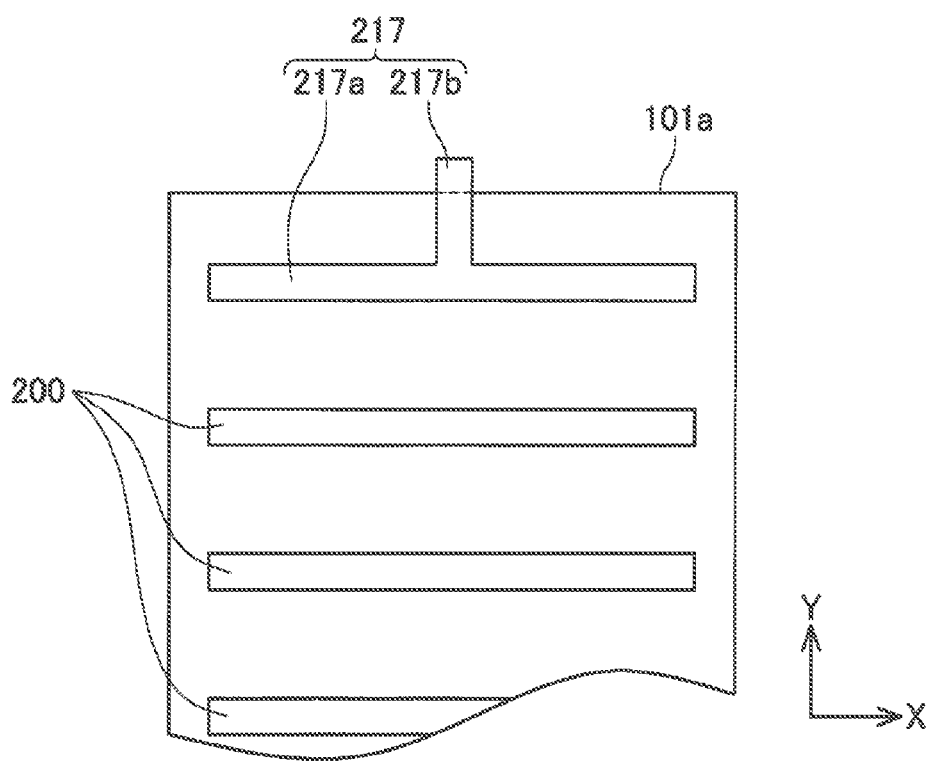
FIG. 12 is a plan view of the semiconductor device according to the modification, and showing, on an enlarged scale, a part of the cell region.

As shown in FIG. 12, a first trench conductor 217 may have a second portion 217b that protrudes from the cell region 101a and extends partially into the peripheral region 103. The second portion 217b has a portion formed in the cell region 101a, and the other portion is formed in the peripheral region 103. A first portion 217a has substantially the same structure as the first portion 210a, and therefore will not be described.

Figure 13:
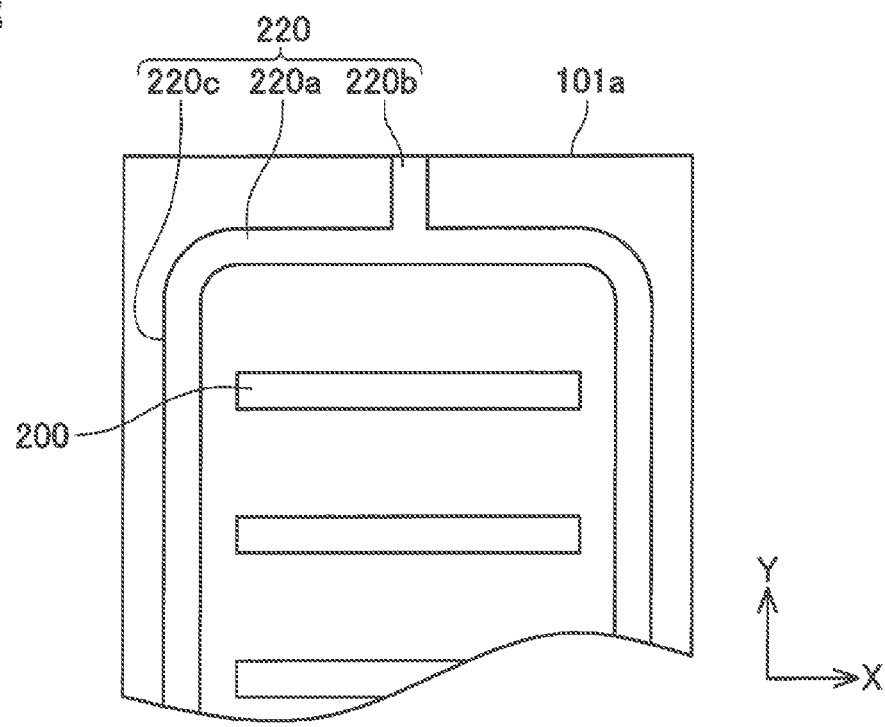
FIG. 13 is a plan view of the semiconductor device according to the modification, and showing, on an enlarged scale, a part of the cell region.
Figure 14:
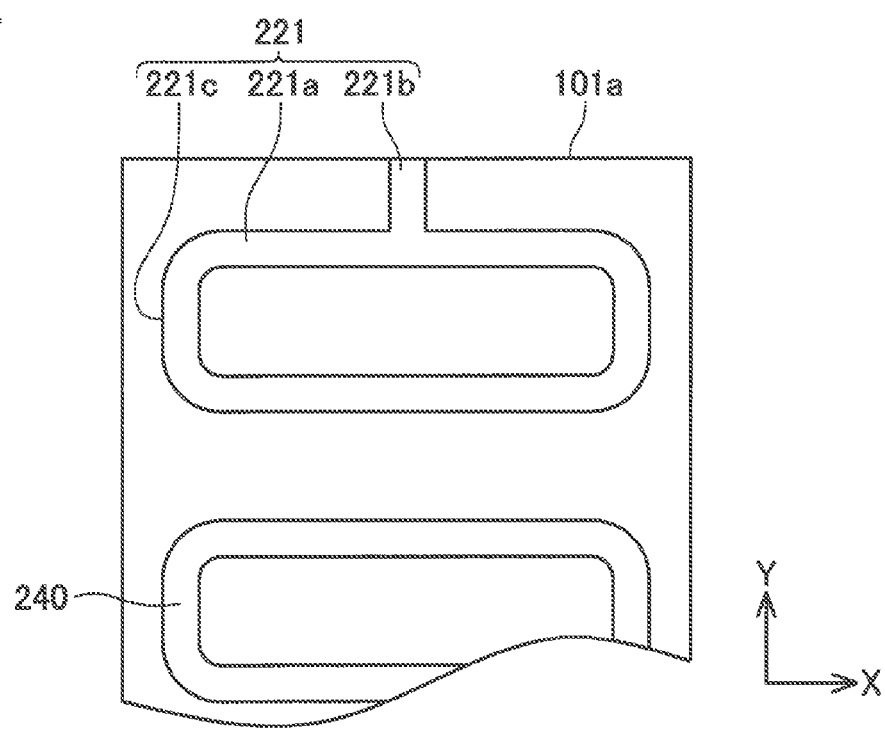
FIG. 14 is a plan view of the semiconductor device according to the modification, and showing, on an enlarged scale, a part of the cell region.

As shown in FIGS. 13 and 14, the first trench conductor may include a portion other than the first and second portions. As shown in FIG. 13, a first trench conductor 220 includes first and third portions 220a and 220c surrounding a periphery of the insulated gate 200, and a second portion 220b extending in the Y direction from the first portion 220a. Although the first and third portions 220a and 220c are shown only partially, these are trench conductors substantially having a continuous rectangular form which surrounds the insulated gates 200 and has round corners. In the trench conductor of the substantially rectangular form, a portion located between, in the Y direction, the insulated gate 200 and the peripheral region 103 is the first portion 220a, and the other portion is the third portion 220c. The first portion 220a extends in the X direction. The second portion 220b extends in the Y direction from a central position in the X direction of the first portion 220a. As shown in FIG. 14, a first trench conductor 221 has a substantially continuous rectangular form, has first and third portions 221a and 221c having round corners, and has a second portion 221b extending in the Y direction from the first portion 221a. The first and third portions 221a and 221c form a trench conductor of a substantially continuous rectangular form similar to that of an insulated gate 240. In the trench conductor having the substantially rectangular form, a portion nearest in the Y direction to the peripheral region 103 is the first portion 221a, and the other portion is the third portion 221c. The first portion 221a extends in the X direction. The second portion 221b extends in the Y direction from the central position in the X direction of the first portion 221a.

Figure 15:
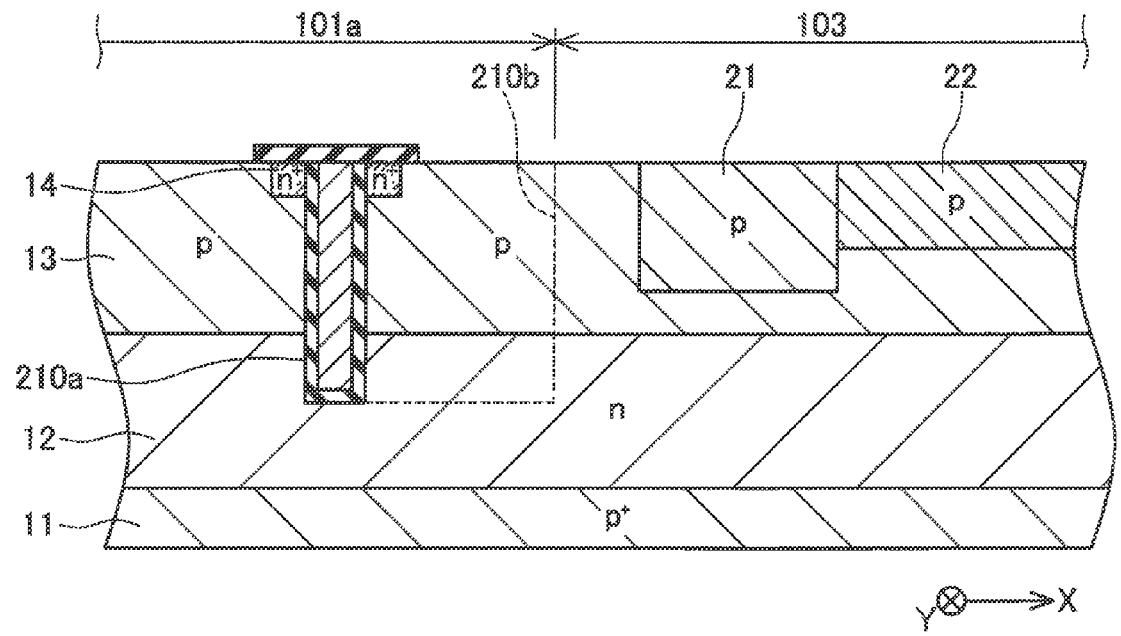
FIG. 15 is a cross section of the semiconductor device according to a modification.
Figure 16:
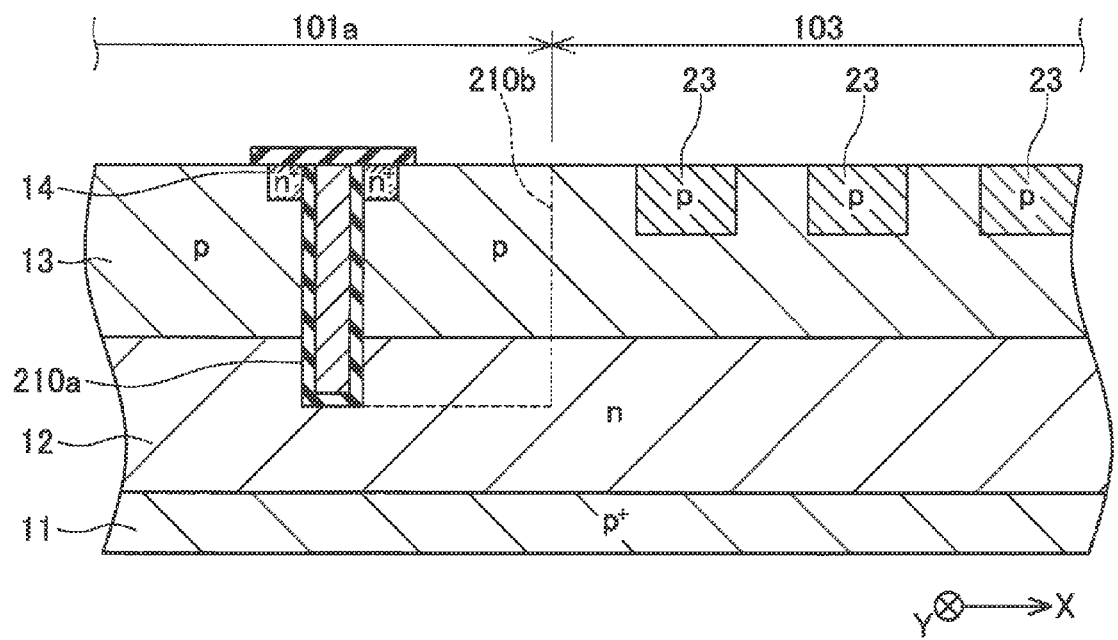
FIG. 16 is a cross section of the semiconductor device according to the modification.

The form of the peripheral region is not restricted to the embodiment already described. FIGS. 15 and 16 show an example of a modification of the peripheral region. FIGS. 15 and 16 show cross sections that are taken along line III-III in FIG. 2 and are extended to the peripheral region 103. As shown in FIG. 15, a peripheral voltage-resistant layer 21 of a high p-type impurity concentration as well as a peripheral voltage-resistant layer 22 of a low p-type impurity concentration may be formed in the peripheral region 103. The peripheral voltage-resistant layer 21 is formed on a side near the cell region 101a, and the peripheral voltage-resistant layer 22 is formed on a side remote from the cell region 101a. The peripheral voltage-resistant layer 21 has a larger depth than the peripheral voltage-resistant layer 22. The peripheral voltage-resistant layer 21 has a width (corresponding to the width in the X direction in FIG. 15) smaller than that of the peripheral voltage-resistant layer 22. As shown in FIG. 16, a plurality of p-type peripheral voltage-resistant layers 23 may be formed in the peripheral region 103. The peripheral voltage-resistant layer 21 is formed on a side near the cell region 101a. The three peripheral voltage-resistant layers 23 have the same p-type impurity concentration, and have the same depth and the same width (corresponding to the width in the X direction in FIG. 16).

Embodiment 1 has been described, by way of example, in connection with the case in which all the first trench conductors have the substantially same forms. However, the first trench conductors of different forms may be present in the one semiconductor device in a mixed fashion. The first trench conductors of different forms may be present in the one cell region in a mixed fashion.

[Embodiment 2]

Figure 17:
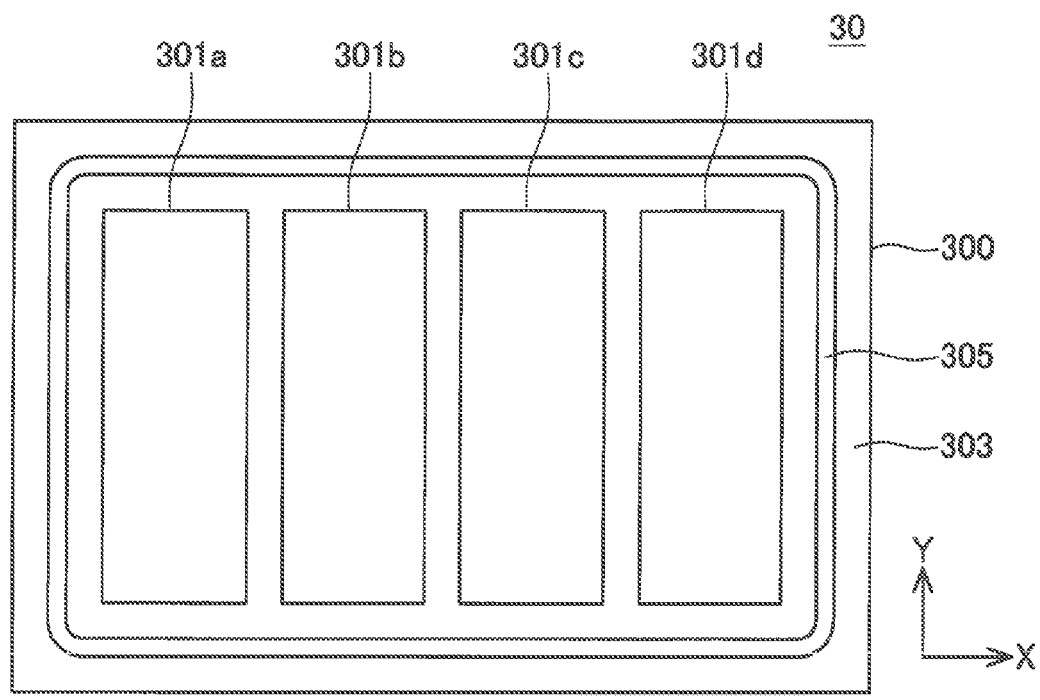
FIG. 17 is a plan view of a semiconductor device according to Embodiment 2.
Figure 18:
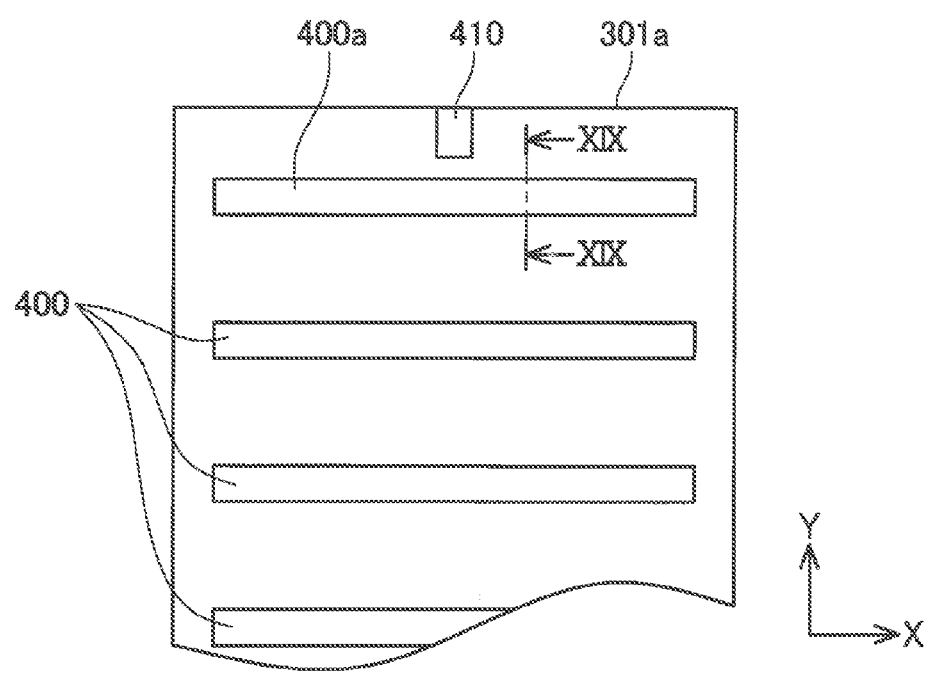
FIG. 18 is an enlarged view of a part of a cell region in the plan view of the semiconductor device in FIG. 17.

As shown in FIG. 17, a semiconductor device 30 according to Embodiment 2 includes a semiconductor substrate 300 including cell regions 301a to 301d and a peripheral region 303 that is a non-cell region. The peripheral region 303 is arranged along a periphery of the semiconductor substrate 300, and surrounds the whole of cell regions 301a to 301d. The cell regions 301a to 301d are arranged in a central portion of the semiconductor substrate 300, and a peripheral voltage-resistant portion 305 surrounding them is formed in the peripheral region 303. As shown in FIG. 18, the cell region 301a is provided with a plurality of trench-type insulated gates 400 and a third trench conductor 400a. The third trench conductor 400a has substantially the same form and the same size as the insulated gate 400. The insulated gate 400 and the third trench conductor 400a are linear in a plan view of the semiconductor device 30, and have the same size and the same form. The insulated gates 400 and the third trench conductor 400a extend parallel to each other in a lengthwise direction (Y direction shown in FIG. 18), and are arranged at a certain gate pitch (distance in the Y direction between the insulated gates 400). A distance between the insulated gate 400 and the third trench conductor 400a is equal to the gate pitch of the insulated gates 400.

Figure 19:
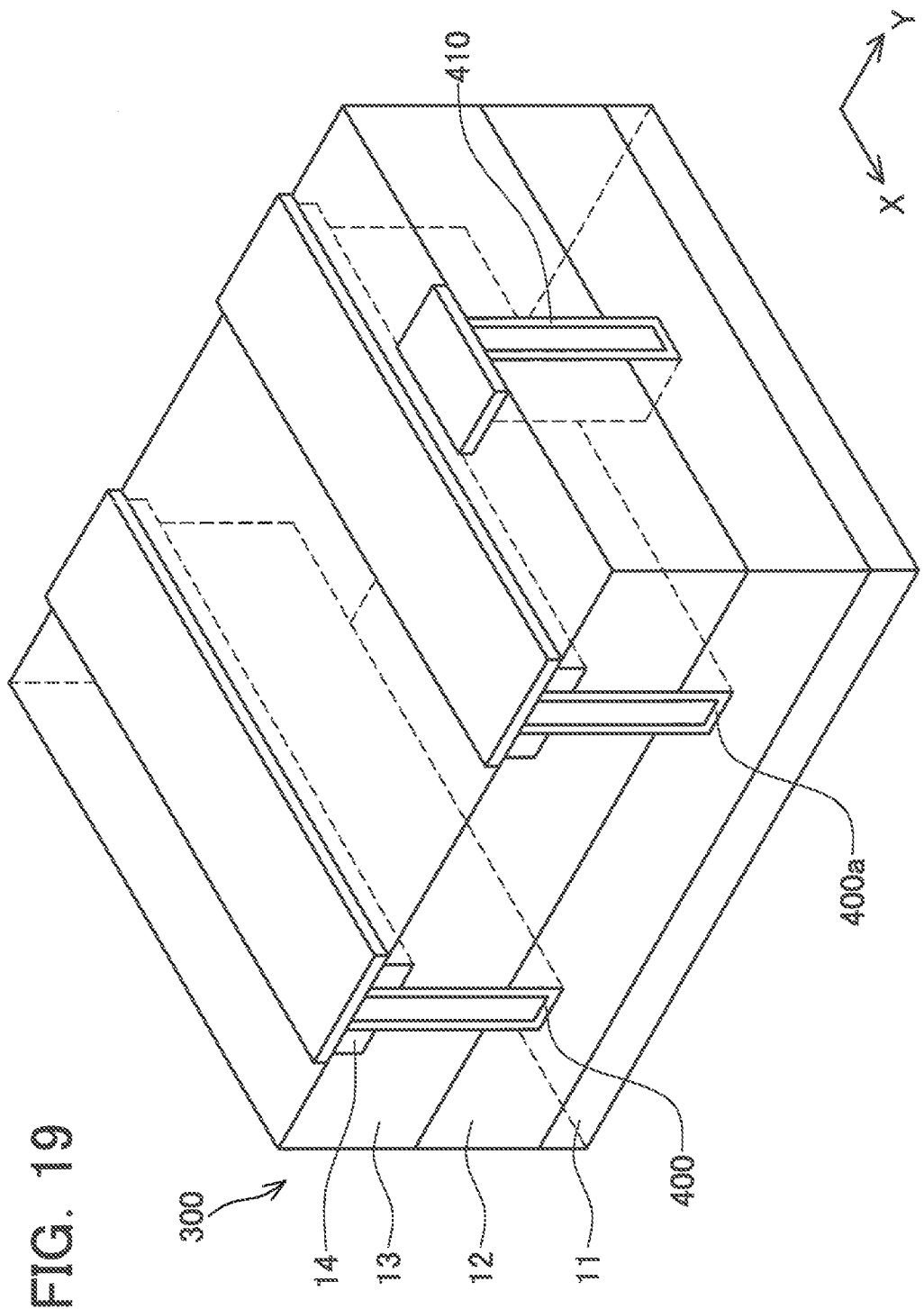
FIG. 19 is a perspective view including a section taken along line XIX-XIX in FIG. 18.

As shown in FIG. 19, the cell region 301a of the semiconductor device 30 is provided with an IGBT of a trench gate type. Structures of the IGBT are substantially the same as those of the semiconductor device 10, and therefore will not be described.

As shown in FIGS. 18 and 19, a fourth trench conductor 410 is formed between the third trench conductor 400a and the peripheral region 303 of the semiconductor device 30. The fourth trench conductor 410 is positioned in the second direction with respect to the third trench conductor 400a. The fourth trench conductor 410 is formed in the cell region 301a. The fourth trench conductor 410 has a conductor covered with an insulation film and filling a trench. The fourth trench conductor 410 extends lengthwise in the second direction (Y direction in FIGS. 18 and 19). The position in the first direction of the fourth trench conductor 410 is a center in the first direction of the third trench conductor 400a. The sizes in the lengthwise and widthwise directions (Y- and X-directions) of the fourth trench conductor 410 are shorter than the lengths in the lengthwise direction of the insulated gate 400 and the third trench conductor 400a. The bottom of the fourth trench conductor 410 is located deeper than a boundary between a body layer 13 and a drift layer 12. A conductor of the fourth trench conductor 410 is electrically connected to the insulated gate 400 and the third trench conductor 400a. Although not shown, the cell regions 301b to 301d are provided with insulated gates, third trench conductors and fourth trench conductors similar to those in the cell region 301a.

Figure 20:
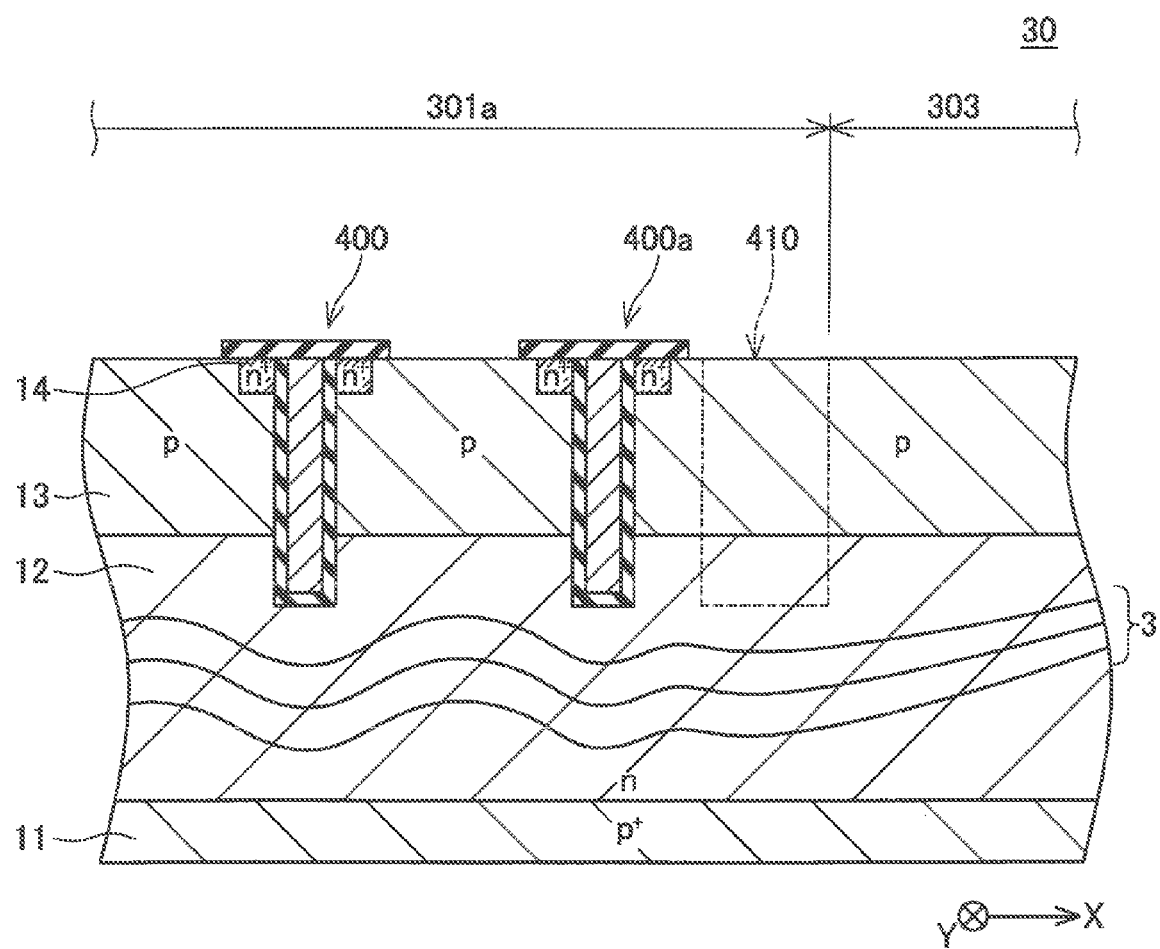
FIG. 20 is a view conceptually showing electric field distribution around a fourth trench conductor of Embodiment 2.

As shown in FIGS. 17 to 19, the semiconductor device 30 has the fourth trench conductor 410 formed in each of the cell regions 301a to 301d between the third trench conductor 400a and the peripheral region 303. For example, when the IGBT in the cell region is turned on and a voltage (e.g. gate voltage) is applied to the fourth trench conductor 410, an electric field at bottoms of the insulated gate 400, the third trench conductor 400a and the fourth trench conductor 410 expands in the Y direction. Thereby, as shown in FIG. 20, the distribution of the electric field near the bottoms of the insulated gate 400, the third trench conductor 400a and the fourth trench conductor 410 is gradual as indicated by equipotential line 3. The semiconductor device 30 can suppress local concentration of the electric field at the bottoms of the insulated gate 400, the third trench conductor 400a and the fourth trench conductor 410, and therefore has an improved breakdown voltage. Since the breakdown voltage of the semiconductor device can be ensured, an area of the peripheral voltage-resistant portion 305 occupying a planar area of the semiconductor substrate 300 can be reduced, which contributes to reduction in sizes of the semiconductor device 30.

(Modification)

The third and fourth trench conductors may have forms other than those already described. For example, the fourth trench conductor may have bottom and side surfaces of the same forms as those of the second portion shown in FIGS. 6 to 9.

Figure 21:
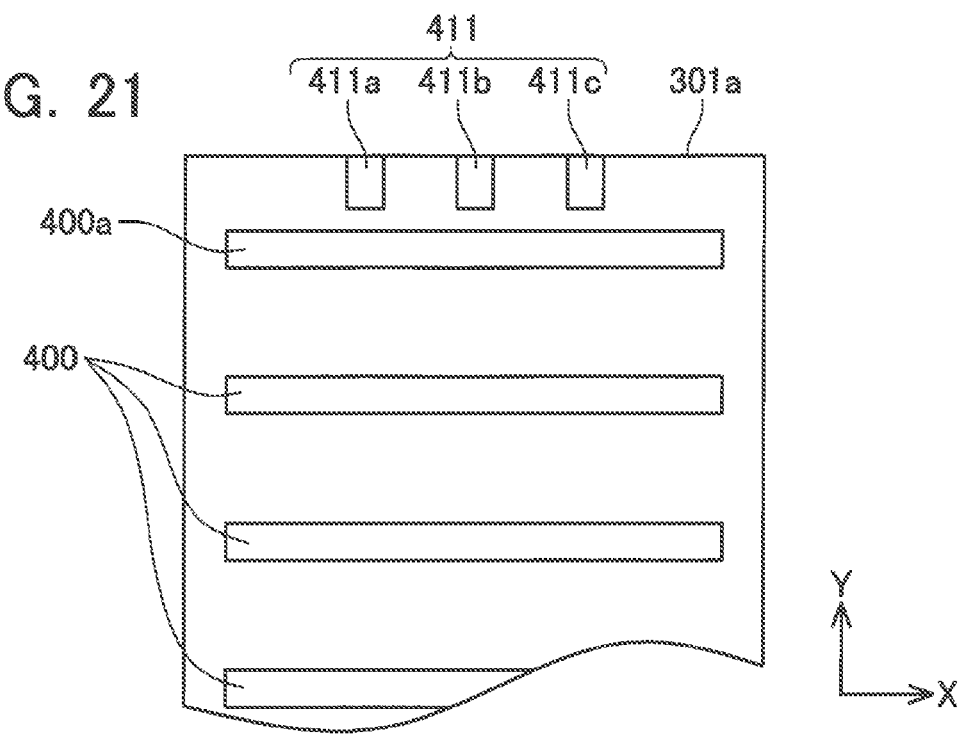
FIG. 21 is a plan view of the semiconductor device according to a modification, and showing, on an enlarged scale, a part of a cell region.
Figure 22:
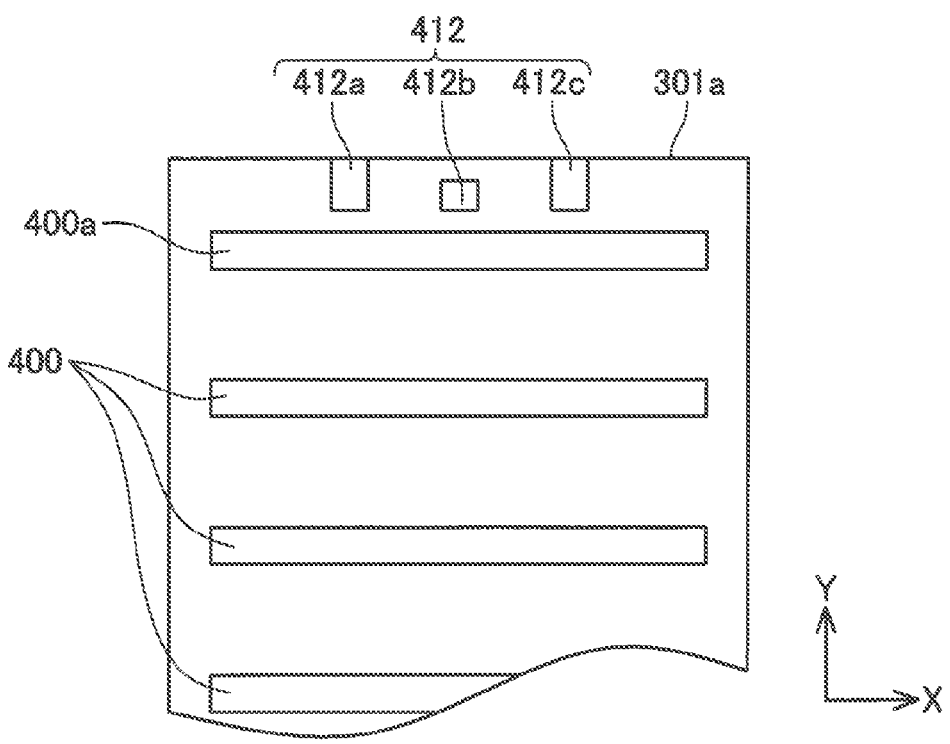
FIG. 22 is a plan view of the semiconductor device according to a modification, and showing, on an enlarged scale, a part of the cell region.

The semiconductor device may have a plurality of fourth trench conductors. For example, as shown in FIG. 21, three fourth tenth conductors 411a, 411b and 411c may be arranged. The fourth trench conductors 411a, 411b and 411c have the same size and the same form, and extend to an end of the cell region 301a in the second direction (Y direction). The fourth trench conductor 411b is arranged in a central position in the first direction (X direction) of the third trench conductor 400a. For example, as shown in FIG. 22, the three fourth trench conductors 412a, 412b and 412c may be arranged. The fourth trench conductors 412a and 412c have the same size and the same form, and a length in the second direction (Y direction) of the fourth trench conductor 412b is shorter than those in the second direction of the fourth trench conductors 412a and 412c. The fourth trench conductors 412a and 412c extend in the second direction (Y direction) to the end of the cell region 301a. An end in the second direction of the fourth trench conductor 412b does not reach the end of the cell region 301a.

Figure 23:
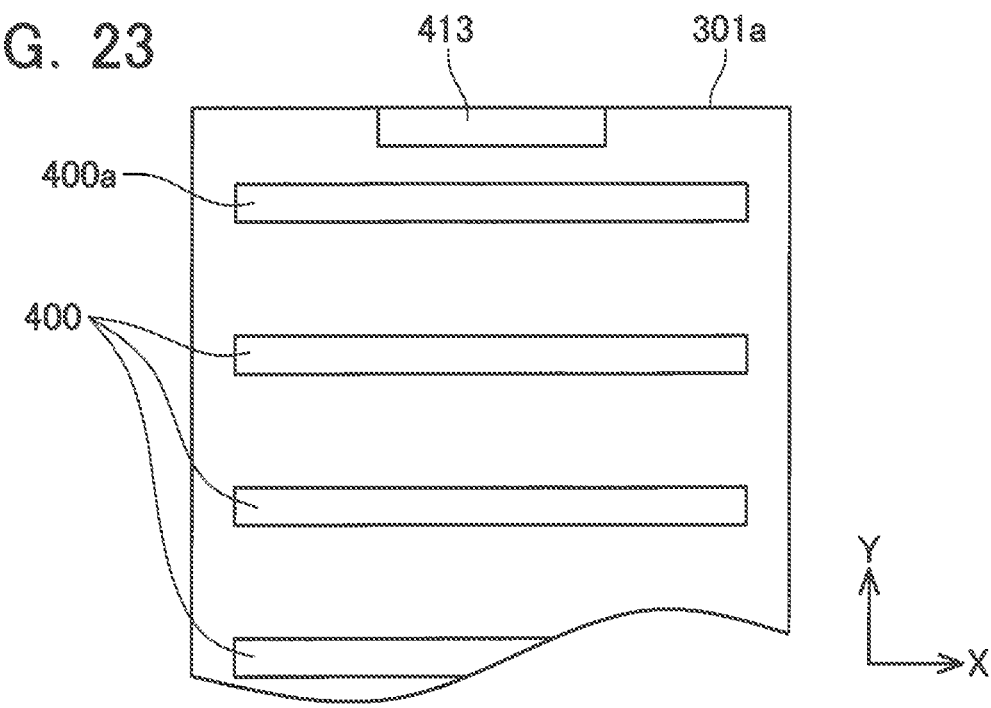
FIG. 23 is a plan view of the semiconductor device according to a modification, and showing, on an enlarged scale, a part of the cell region.

As shown in FIG. 23, a fourth trench conductor 413 extending lengthwise in the first direction (X direction) may be arranged. The length in the first direction of the fourth trench conductor 413 is merely required to be shorter than the lengths in the first direction of the insulated gate 400 and the third trench conductor 400a.

Figure 24:
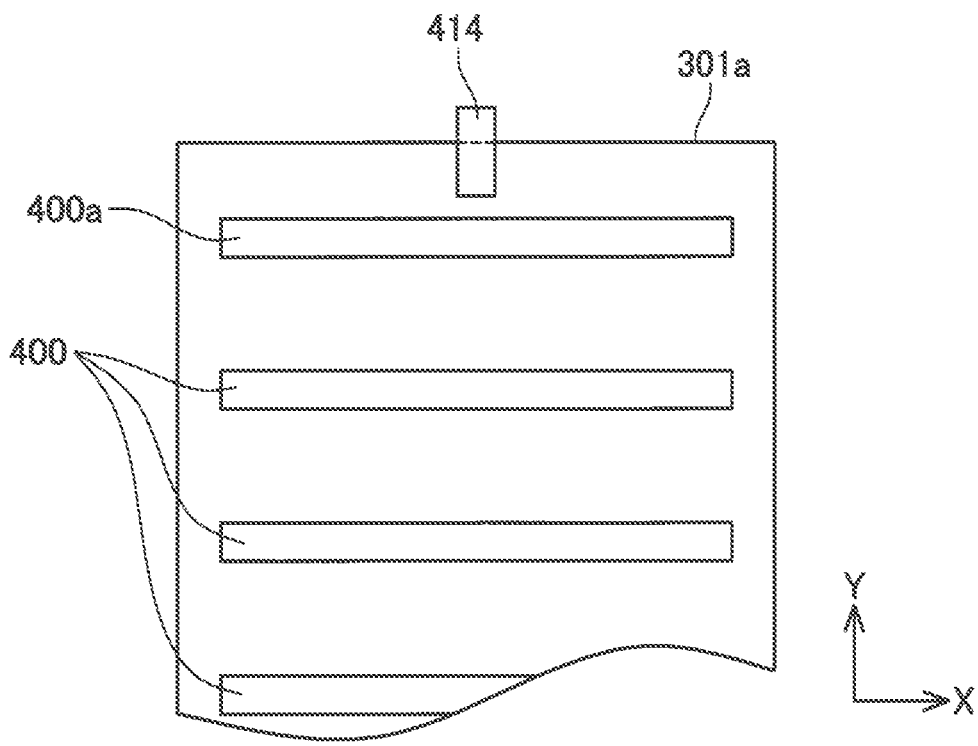
FIG. 24 is a plan view of the semiconductor device according to a modification, and showing, on an enlarged scale, a part of the cell region.

As shown in FIG. 24, a fourth trench conductor 414 protruding from the cell region 301a and having a portion extending into the peripheral region 303 may be arranged. The fourth trench conductor 414 has a portion formed in the cell region 301a, and the other portion is formed in the peripheral region 303.

Figure 25:
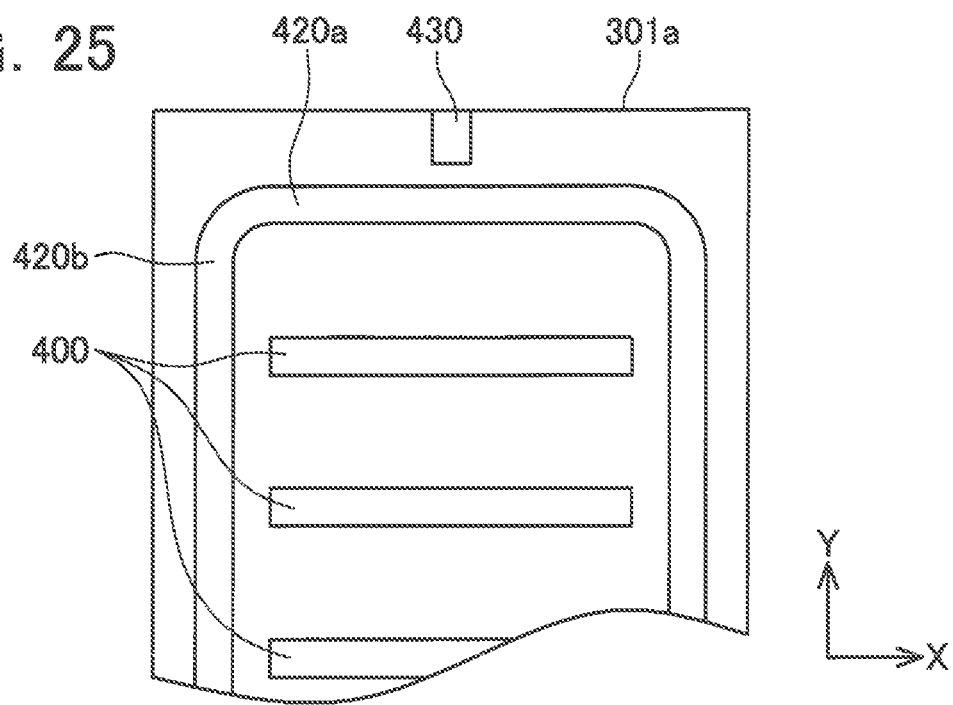
FIG. 25 is a plan view of the semiconductor device according to a modification, and showing, on an enlarged scale, a part of the cell region.
Figure 26:
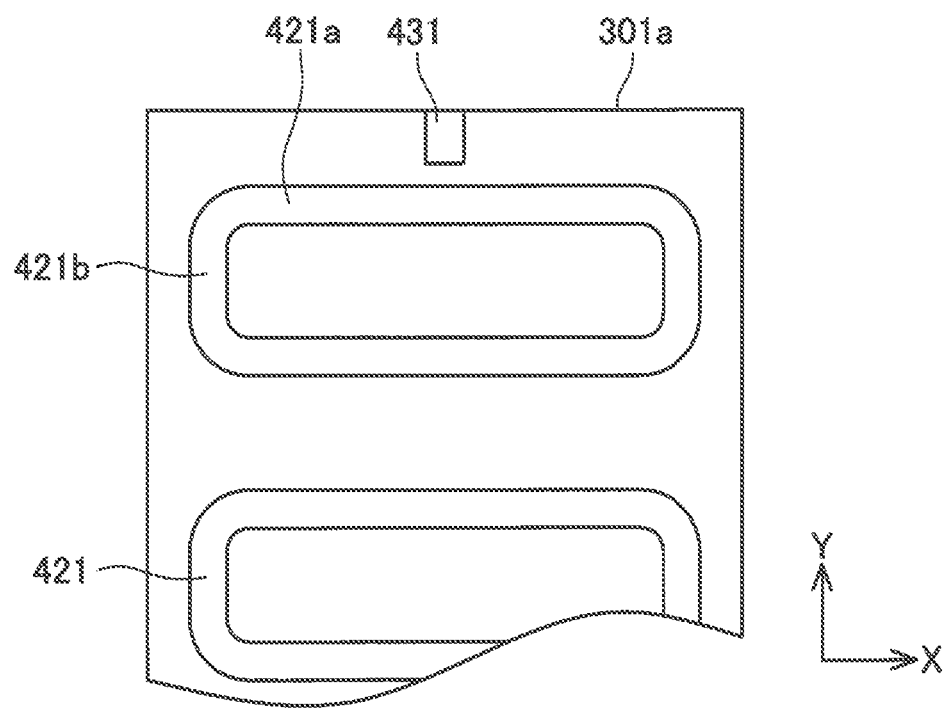
FIG. 26 is a plan view of the semiconductor device according to a modification, and showing, on an enlarged scale, a part of the cell region.

As shown in FIGS. 25 and 26, the third trench conductor may be a part of a trench conductor of a non-linear form. As shown in FIG. 25, a third trench conductor 420a is formed continuously to a fifth trench conductor 420b, and these form a substantially rectangular form surrounding a periphery of the insulated gate 400 and having round corners, although shown only partially. In the trench conductor of the substantially rectangular form, a portion occupying a position in the Y direction between the insulated gate 400 and the peripheral region 303 is the third trench conductor 420a, and the other portion is the fifth trench conductor 420b. The third trench conductor 420a extends in the X direction. A fourth trench conductor 430 is positioned in the Y direction with respect to the third trench conductor 420a. The position is the X direction of the fourth trench conductor 430 is a center in the X direction of the third trench conductor 420a. A distance in the Y direction between the third and fourth trench conductors 420a and 430 is longer than that in the Y direction between the third trench conductor 420a and the insulated gate 400. As shown in FIG. 26, a third trench conductor 421a and a fifth trench conductor 421b may form a trench conductor of a substantially rectangular and continuous form having round corners, and may have substantially the same form as an insulated gate 421. A distance between the third trench conductor 421a and a fourth trench conductor 431 is shorter than a distance in the Y direction between the insulated gate 421 and the third trench conductor 421a as well as a gate pitch of the insulated gates 421.

The form of the peripheral region is not restricted to that of the embodiment already described. For example, forms similar to that described with reference to FIGS. 15 and 16 in Embodiment 1 may be employed.

Similarly to Embodiment 1, the third and fourth trench conductors of different forms may be present in the one semiconductor device in a mixed fashion. Also, the third and fourth trench conductors of different forms may be present in the one cell region in a mixed fashion.

Figure 27:
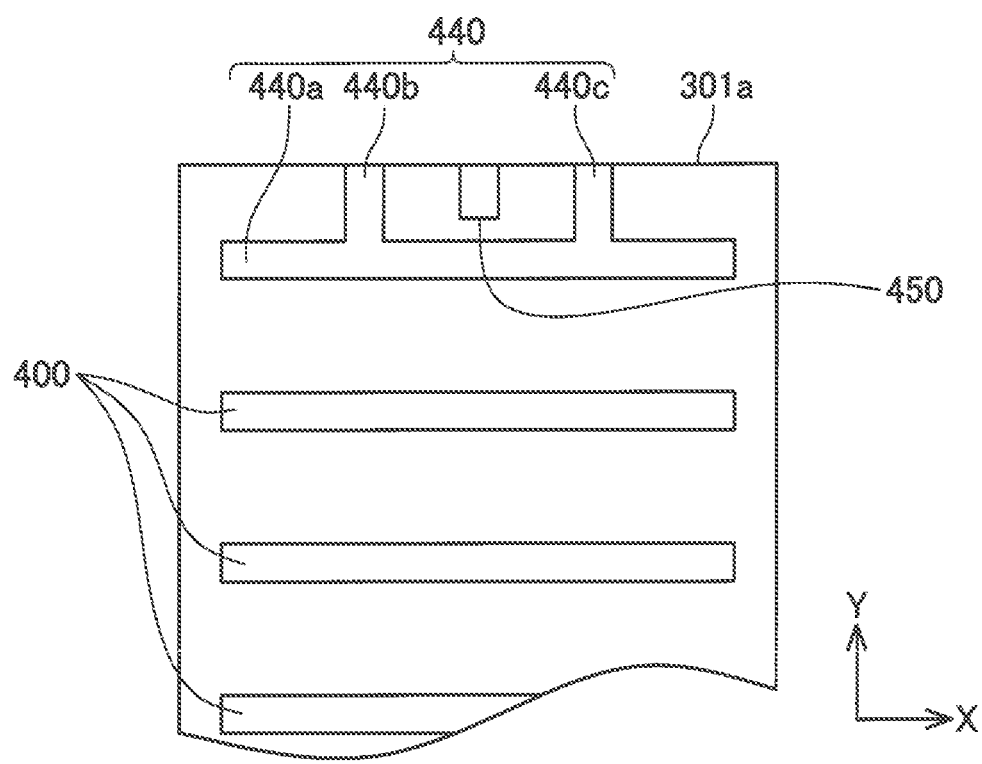
FIG. 27 is a plan view of the semiconductor device according to a modification, and showing, on an enlarged scale, a part of the cell region.

As shown in FIG. 27, a second trench conductor 450 may be additionally employed at the vicinity of a first trench conductor 440 described in Embodiment 1. The first trench conductor 440 includes a first portion 440a and two second portions 440b and 440c. The second trench conductor 450 is positioned in the X direction between the second portions 440b and 440c, and is present in the Y direction between the first portion 440a and the peripheral region. The form, size and material of the second trench conductor 450 are substantially the same as those of the fourth trench conductor 410 shown in FIG. 18 and others. The second trench conductor 450 is not arranged near the third trench conductor 400a, but is arranged near the first trench conductor, which is a difference from the fourth trench conductor 410.

Although the IGBT has been described by way of example, the structures of the insulated gate and the trench conductor in the present application can be applied to other semiconductor devices of the trench gate type such as an MOSFET. In the semiconductor devices other than the IGBT, the first, fourth or second trench conductor can relieve the electric field concentration to achieve the effect of improving the breakdown voltage of the semiconductor device.

Figure 28:
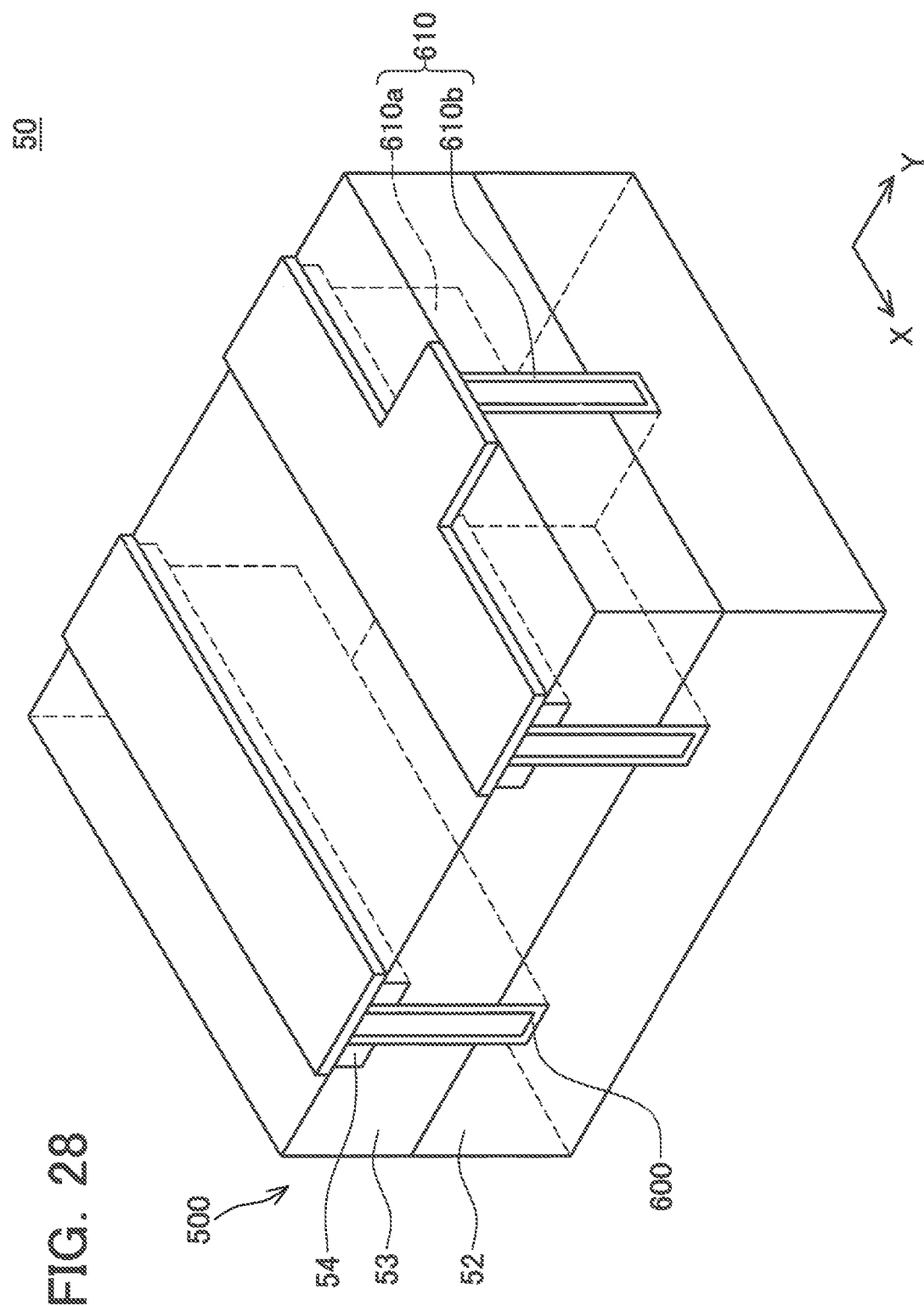
FIG. 28 is a perspective view of the semiconductor device according to a modification.

For example, the structures of the insulated gates and others relating to the IGBT already described in the embodiments and modifications can likewise be used in a semiconductor device 50 provided with MOSFETs as shown in FIG. 28. A semiconductor substrate 500 includes an n-type drain layer 52, a p-type body layer 53, and an $n^+$ type source layer 54. An insulated gate 600 extends from a surface side of the semiconductor substrate 500 through the body layer 53 and the source layer 54 to the drain layer 52. Similarly to FIG. 3, a first trench conductor 610 is formed between the insulated gate 600 and a peripheral region. The first trench conductor 610 includes first and second portions 610a and 610b. The structure of the first trench conductor 610 is substantially the same as that of the first trench conductor 210 shown in FIG. 3, and therefore will not be described. In this case, when a voltage is applied across front and rear surface electrodes of the semiconductor device 50, a voltage is also applied to the first trench conductor 610 so that an electric field at bottoms of the insulated gate 600 and the first trench conductor 610 can expand in the Y direction. Similarly to FIG. 4, therefore, it is possible to suppress local concentration of the electric field at the bottoms of the insulated gate 680 and the first trench conductor 610.

Figure 29:
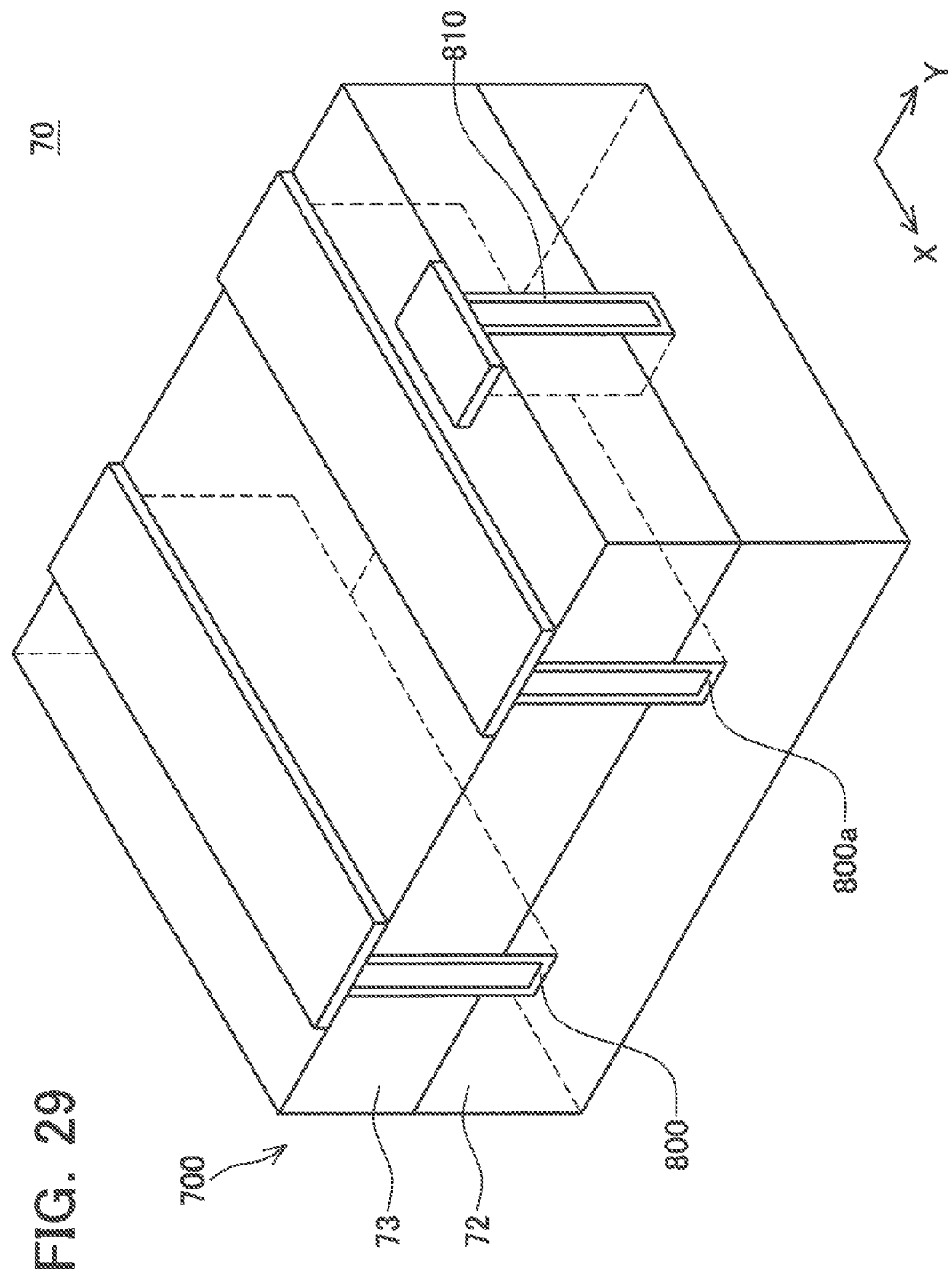
FIG. 29 is a perspective view of the semiconductor device according to a modification.

The structures of the insulated gates and others relating to the IGBT described in the embodiments and the modifications can be utilized in a semiconductor device 70 provided with diodes, as shown in FIG. 29. A semiconductor substrate 700 includes an n-type cathode layer 72 and a p-type anode layer 73, as shown in FIG. 29. An insulated gate 800 and a third trench conductor 800a extend from a surface side of the semiconductor substrate 700 through the anode layer 73 to the cathode layer 72. Similarly to FIG. 19, a fourth trench conductor 810 is formed between the third trench conductor 800a and a peripheral region. Structures of the third and fourth trench conductors 800a and 810 are substantially the same as those of the third and fourth trench conductors 400a and 410 shown in FIG. 3, and therefore will not be described below. In this case, when a voltage is applied across front and rear surface electrodes of the semiconductor device 70, a voltage is also applied to the third and fourth trench conductors 800a and 810 so that an electric field at bottoms of the insulated gate 800 and the third and fourth trench conductors 808a and 810 can expand in the Y direction. Similarly to FIG. 4, therefore, it is possible to suppress local concentration of an electric field at the bottoms of the insulated gate 800 and the third and fourth trench conductors 800a and 810.

Specific examples of the present invention have been described in detail, however, these are mere exemplary indications and thus do not limit the scope of the claims. The art described in the claims includes modifications and variations of the specific examples presented above.

Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

The invention claimed is:

1. A semiconductor device comprising a semiconductor substrate including a cell region and a non-cell region arranged around the cell region, wherein:
   the cell region comprises:
   a first semiconductor region of a first conductivity type;
   a second semiconductor region of a second conductivity type formed on a surface of the semiconductor substrate on a front surface side of the first semiconductor region;
   an insulated gate of a trench type extending from a surface side of the semiconductor substrate through the second semiconductor region to a depth where the insulated gate is in contact with the first semiconductor region, a lengthwise direction of the insulated gate being extended in a first direction; and
   a first trench conductor formed at least partially in the cell region between the insulated gate and the non-cell region, and having a conductor that is covered with an insulation film and fills a trench,
   the first trench conductor includes a first portion extending in the first direction, and a second portion protruding in a second direction perpendicularly crossing the first direction and extending from a cell region side toward the non-cell region, and
   at least a part of a bottom of the second portion reaches a position deeper than a boundary between the first and second semiconductor regions;

wherein the semiconductor device, further comprising:
   a second trench conductor formed at least partially in the cell region between the first portion of the first trench conductor and the non-cell region, and having a conductor that is covered with the insulation film and fills a trench, wherein:
   the second trench conductor is positioned in the second direction with respect to the first portion of the first trench conductor,
   a length of the second trench conductor in the first direction is shorter than a length of the insulated gate in the first direction,
   a distance between the first portion of the first trench conductor and the second trench conductor is shorter than a distance between the first trench conductor and the insulated gate nearest to the first trench conductor, and
   at least a part of the second trench conductor reaches a position deeper than the boundary between the first and second semiconductor regions.

2. A semiconductor device comprising a semiconductor substrate including a cell region and a non-cell region arranged around the cell region, wherein:
   the cell region comprises:
   a first semiconductor region of a first conductivity type;
   a second semiconductor region of a second conductivity type formed on a surface of the semiconductor substrate on a front surface side of the first semiconductor region;
   an insulated gate of a trench type extending from a surface side of the semiconductor substrate through the second semiconductor region to a depth where the insulated gate is in contact with the first semiconductor region, a lengthwise direction of the insulated gate being extended in a first direction;
   a third trench conductor formed in the cell region between the insulated gate and the non-cell region, and having a conductor that is covered with an insulation film and fills a trench extending in the first direction; and
   a fourth trench conductor formed at least partially in the cell region between the insulated gate and the non-cell region, and having a conductor that is covered with the insulation film and fills a trench located, with respect to the third trench conductor, in a second direction perpendicularly crossing the first direction and extending from a cell region side toward the non-cell region,
   a length of the fourth trench conductor in the first direction is shorter than a length of the insulated gate in the first direction,
   a distance between the third and fourth trench conductors is shorter than a distance between the third trench conductor and the insulated gate nearest to the third trench conductor, and
   at least a part of the fourth trench conductor reaches a position deeper than a boundary between the first and second semiconductor regions.

* * * * *

UNITED STATES PATENT AND TRADEMARK OFFICE
CERTIFICATE OF CORRECTION

PATENT NO. : 9,082,842 B2
APPLICATION NO. : 14/359761
DATED : July 14, 2015
INVENTOR(S) : Y. Hirabayashi It is certified that error appears in the above-identified patent and that said Letters Patent is hereby corrected as shown below:

Specification

At column 6, line 47, change "regions $101a$ to laid" to -- regions $101a$ to $101d$ --.

At column 7, line 50, change "device 10 rah suppress" to -- device 10 can suppress --.

At column 8, line 10, change "d3 is larger than the depth d" to -- d3 is larger than the depth d4 --.

At column 8, line 57, change "portion $215e$ is arranged" to -- portion $215c$ is arranged --.

At column 8, line 64, change "portion $216e$ is shorter" to -- portion $216c$ is shorter --.

At column 11, line 20, change "fourth tenth conductors" to -- fourth trench conductors --.

At column 12, line 62, change "gate 680 and" to -- gate 600 and --.

At column 13, line 16, change "$808a$ and 810" to -- $800a$ and 810 --.

Signed and Sealed this
Twenty-first Day of June, 2016

Michelle K. Lee
*Director of the United States Patent and Trademark Office*